United States Patent
Yang et al.

(10) Patent No.: US 9,978,835 B2
(45) Date of Patent: May 22, 2018

(54) SEMICONDUCTOR DEVICE INCLUDING NANOWIRE TRANSISTOR

(71) Applicant: Samsung Electronics Co., Ltd., Suwon-si (KR)

(72) Inventors: Jung-Gil Yang, Suwon-si (KR); Sang-Su Kim, Yongin-si (KR); Sung-Gi Hur, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/339,690

(22) Filed: Oct. 31, 2016

(65) Prior Publication Data

US 2017/0047402 A1 Feb. 16, 2017

Related U.S. Application Data

(60) Continuation of application No. 15/075,888, filed on Mar. 21, 2016, now Pat. No. 9,515,147, which is a
(Continued)

(30) Foreign Application Priority Data

Oct. 2, 2013 (KR) ........................ 10-2013-0118124

(51) Int. Cl.
*H01L 29/06* (2006.01)
*H01L 29/267* (2006.01)
(Continued)

(52) U.S. Cl.
CPC .... *H01L 29/0673* (2013.01); *H01L 21/02233* (2013.01); *H01L 27/088* (2013.01);
(Continued)

(58) Field of Classification Search
CPC ........... H01L 29/78696; H01L 29/0673; H01L 29/66742; H01L 29/78684;
(Continued)

(56) References Cited

U.S. PATENT DOCUMENTS

| | | |
|---|---|---|
| 7,402,483 B2 | 7/2008 | Yun et al. |
| 7,781,800 B2 | 8/2010 | Chen et al. |

(Continued)

FOREIGN PATENT DOCUMENTS

| | | |
|---|---|---|
| JP | 2011-029503 | 2/2011 |
| KR | 10-2007-0068736 A | 7/2007 |
| KR | 10-2008-0011488 A | 2/2008 |

OTHER PUBLICATIONS

C. Auth et al. / 45nm High-k+ Metal Gate Strain-Enhanced Transistor / 2008 Symposium on VLSI Technology.
(Continued)

*Primary Examiner* — Thanhha Pham
(74) *Attorney, Agent, or Firm* — Muir Patent Law, PLLC

(57) ABSTRACT

A semiconductor device includes at least one nanowire that is disposed over a substrate, extends to be spaced apart from the substrate, and includes a channel region, a gate that surrounds at least a part of the channel region, and a gate dielectric film that is disposed between the channel region and the gate. A source/drain region that contacts one end of the at least one nanowire is formed in a semiconductor layer that extends from the substrate to the one end of the at least one nanowire. Insulating spacers are formed between the substrate and the at least one nanowire. The insulating spacers are disposed between the gate and the source/drain region and are formed of a material that is different from a material of the gate dielectric film.

16 Claims, 48 Drawing Sheets

Related U.S. Application Data division of application No. 14/489,418, filed on Sep. 17, 2014, now Pat. No. 9,324,812.

(51) Int. Cl.

| | | |
|---|---|---|
| *H01L 29/786* | (2006.01) | |
| *H01L 29/423* | (2006.01) | |
| *H01L 29/20* | (2006.01) | |
| *H01L 21/02* | (2006.01) | |
| *H01L 29/66* | (2006.01) | |
| *H01L 27/088* | (2006.01) | |
| *H01L 29/78* | (2006.01) | |
| *H01L 29/08* | (2006.01) | |
| *H01L 29/16* | (2006.01) | |
| *H01L 29/161* | (2006.01) | |
| *H01L 21/8234* | (2006.01) | |
| *H01L 27/092* | (2006.01) | |

(52) U.S. Cl.
CPC ........ *H01L 29/068* (2013.01); *H01L 29/0642* (2013.01); *H01L 29/0676* (2013.01); *H01L 29/0847* (2013.01); *H01L 29/16* (2013.01); *H01L 29/161* (2013.01); *H01L 29/1608* (2013.01); *H01L 29/20* (2013.01); *H01L 29/267* (2013.01); *H01L 29/42392* (2013.01); *H01L 29/66545* (2013.01); *H01L 29/66742* (2013.01); *H01L 29/66795* (2013.01); *H01L 29/785* (2013.01); *H01L 29/78684* (2013.01); *H01L 29/78696* (2013.01); *H01L 21/823412* (2013.01); *H01L 27/092* (2013.01)

(58) Field of Classification Search
CPC ........... H01L 29/42392; H01L 29/0676; H01L 29/068; H01L 29/20; H01L 29/267; H01L 29/66795; H01L 29/785; H01L 29/66545; H01L 21/02233
USPC ........................................................ 438/151
See application file for complete search history.

(56) References Cited

U.S. PATENT DOCUMENTS

| | | | |
|---|---|---|---|
| 8,008,146 | B2 | 8/2011 | Bangsaruntip et al. |
| 8,097,515 | B2 | 1/2012 | Bangsaruntip et al. |
| 8,110,458 | B2 | 2/2012 | Jin et al. |
| 8,110,471 | B2 | 2/2012 | Lee et al. |
| 8,129,777 | B2 | 3/2012 | Kim et al. |
| 8,173,993 | B2 | 5/2012 | Bangsaruntip et al. |
| 8,241,971 | B2 | 8/2012 | Bangsaruntip et al. |
| 8,309,991 | B2 | 11/2012 | Bangsaruntip et al. |
| 8,324,030 | B2 | 12/2012 | Bangsaruntip et al. |
| 8,373,223 | B2 | 2/2013 | Choi |
| 8,399,314 | B2 | 3/2013 | Cohen et al. |
| 8,513,068 | B2 | 8/2013 | Bangsaruntip et al. |
| 8,586,966 | B2 | 11/2013 | Bangsaruntip et al. |
| 8,900,951 | B1 | 12/2014 | Cheng et al. |
| 9,324,812 | B2 * | 4/2016 | Yang ................... H01L 29/0676 |
| 9,515,147 | B2 * | 12/2016 | Yang ................... H01L 29/0676 |
| 2006/0240622 | A1 | 10/2006 | Lee et al. |
| 2007/0196973 | A1 * | 8/2007 | Park ................ H01L 21/823412 438/197 |
| 2008/0283906 | A1 * | 11/2008 | Bohr .................... H01L 29/045 257/327 |
| 2009/0289304 | A1 | 11/2009 | Pouydebasque et al. |
| 2011/0233522 | A1 | 9/2011 | Cohen et al. |
| 2011/0278546 | A1 | 11/2011 | Bangsaruntip et al. |
| 2014/0175379 | A1 | 6/2014 | Chu-Kung et al. |
| 2014/0339611 | A1 | 11/2014 | Leobandung |
| 2017/0053998 | A1 * | 2/2017 | Kim et al. ........ H01L 29/66553 257/347 |

OTHER PUBLICATIONS

C. Dupre et al. / 15nm-Diameter 3D Stacked Nanowires with Independent Gates Operation: ØFET / 2008 International Electron Devices Meeting.

* cited by examiner

XB-XB'

XB-XB'

XB-XB'

XB-XB'

XB-XB'

YC-YC'

YD-YD'

YC-YC'

YD-YD'

YC-YC'

YD-YD'

XB-XB'

XB-XB'

YC-YC'

YD-YD'

XB-XB'

XB-XB'

XB-XB'

XB-XB'

XB-XB'

XB-XB'

YD-YD'

XB-XB'

YD-YD'

XB-XB'

YD-YD'

XB-XB'

YC-YC'

YD-YD'

SEMICONDUCTOR DEVICE INCLUDING NANOWIRE TRANSISTOR

CROSS-REFERENCE TO RELATED APPLICATIONS

This application is a Continuation of U.S. patent application Ser. No. 15/075,888 filed on Mar. 21, 2016, now allowed, which is a Divisional Application of U.S. patent application Ser. No. 14/489,418 filed on Sep. 17, 2014, now U.S. Pat. No. 9,324,812, which claims priority under 35 USC § 119 to Korean Patent Application No. 10-2013-0118124, filed on Oct. 2, 2013, in the Korean Intellectual Property Office, the disclosure of each of which is incorporated herein in its entirety by reference.

BACKGROUND

The present disclosure relates to a semiconductor device, and more particularly, to a semiconductor device including a nanowire transistor.

As semiconductor devices have been highly integrated, an operation speed of an integrated circuit including many transistors may depend on the performance of the transistors. Accordingly, various technologies for obtaining a transistor that may operate at a high speed and a low voltage have been developed.

SUMMARY

Various exemplary embodiments provide a semiconductor device that may reduce parasitic capacitance and resistance between a source/drain region and a gate.

According to one exemplary embodiment, there is provided a semiconductor device including: at least one nanowire that is disposed over a substrate, extends to be spaced apart from the substrate, and includes a channel region; a gate that surrounds at least a part of the channel region; a gate dielectric film that is disposed between the channel region and the gate; a semiconductor layer that extends from the substrate to one end of the at least one nanowire, and includes a source/drain region that contacts the one end of the at least one nanowire; and insulating spacers that are disposed between the gate and the source/drain region and between the substrate and the at least one nanowire, and are formed of a material that is different from a material of the gate dielectric film.

The gate dielectric film may be disposed between the gate and the insulating spacers.

The insulating spacers may be formed of a first material that has a first dielectric constant, and the gate dielectric film may be formed of a second material that has a second dielectric constant higher than the first dielectric constant.

The at least one nanowire may be formed of a group IV semiconductor, a group IV-IV compound semiconductor, or a group III-V compound semiconductor. The group III-V compound semiconductor may be formed of, for example, InGaAs, InAs, GaSb, InSb, or a combination thereof.

The insulating spacers may be formed of an oxide of a group IV semiconductor, an oxide of a group IV-IV compound semiconductor, an oxide of a group III-V compound semiconductor, or a silicon oxide.

The semiconductor layer may be formed of, for example, a SiGe film, a Ge film, a SiC film, or an InGaAs film.

The semiconductor device may further include a buffer layer that is disposed in a first region of the substrate and between the substrate and the gate, wherein the buffer layer is formed of a material that has a lattice constant that is higher than a lattice constant of the substrate.

The insulating spacers are first insulating spacers, and the semiconductor device may further include second insulating spacers that are disposed over the at least one nanowire and cover side walls of the gate, wherein the first insulating spacers and the second insulating spacers are formed of different materials. The first insulating spacers and the second insulating spacers may be formed at different levels on the substrate to vertically overlap with each other.

The at least one nanowire may include a plurality of nanowires that have different distances from the substrate, wherein the insulating spacers include a plurality of insulating spacers that are formed in spaces between the plurality of nanowires.

According to another exemplary embodiment, there is provided a semiconductor device including: a first transistor that is formed in a first region of a substrate, and a second transistor that is formed in a second region of the substrate, wherein the first transistor includes: a first nanowire that includes a first channel region; a first gate that surrounds the first nanowire; a first gate dielectric film that is disposed between the first nanowire and the first gate; a first source/drain region that is connected to one end of the first nanowire; and first inner insulating spacers that are disposed between the first gate dielectric film and the first source/drain region, the first gate dielectric film may further be disposed between the first source/drain region and the first gate, and the second transistor includes: a second nanowire that includes a second channel region; a second gate that surrounds the second nanowire; a second gate dielectric film that is disposed between the second nanowire and the second gate; and a second source/drain region that is connected to one end of the second nanowire and is formed of a material that is different from a material of the first source/drain region.

The second transistor may further include second inner insulating spacers that are disposed between the second gate dielectric film and the second source/drain region, the second gate dielectric film may further be disposed between the second source/drain region and the second gate.

At least one of the first inner insulating spacers and the second inner insulating spacers may be formed of an oxide of a group IV semiconductor, an oxide of a group IV-IV compound semiconductor, an oxide of a group III-V compound semiconductor, or a silicon oxide.

The first inner insulating spacers and the first gate dielectric film may be formed of different materials.

According to still another exemplary embodiment, there is provided a method of manufacturing a semiconductor device, the method including: preparing a substrate; forming a first semiconductor layer and a second semiconductor layer sequentially disposed on the substrate, the second semiconductor layer including a material different from that of the first semiconductor layer; forming a third semiconductor layer in order to form source/drain regions by forming trenches disposed at both ends of the second semiconductor layer in a first region of the substrate; forming a gate surrounding a portion of the second semiconductor layer; forming first insulating spacers disposed between the gate and the source/drain regions; and forming second insulating spacers disposed between the second semiconductor layer and the substrate and between the gate and the source/drain regions. The gate includes a gate dielectric layer having a material different from those of the first and second insulating spacers. The first insulating spacers surround a portion of the second semiconductor layer and portions of the second insulating spacers.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE EMBODIMENTS

Figure 1A:
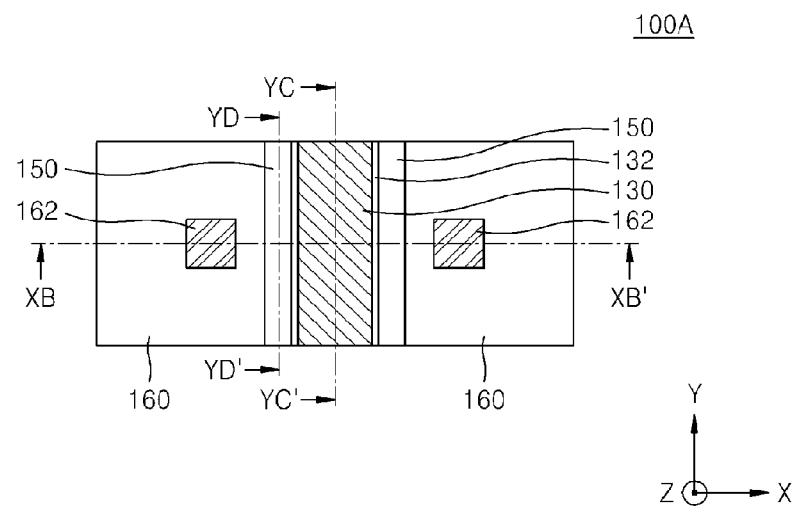
FIGS. 1A through 1D are views illustrating a semiconductor device according to an embodiment.

Various example embodiments will now be described more fully with reference to the accompanying drawings, in which exemplary embodiments are shown. The disclosure may, however, be embodied in many different forms and should not be construed as being limited to the embodiments set forth herein. The same elements are denoted by the same reference numerals, and a repeated explanation thereof will not be given.

As used herein, the term "and/or" includes any and all combinations of one or more of the associated listed items. Expressions such as "at least one of" when preceding a list of elements, modify the entire list of elements and do not modify the individual elements of the list.

It will be understood that, although the terms first, second, third etc. may be used herein to describe various members, regions, layers, portions, and/or elements, these members, regions, layers, portions, and/or elements should not be limited by these terms. Unless indicated otherwise, these terms are used to distinguish one member, region, portion, or element from another member, region, portion, or element. Thus, a first member, region, portion, or element discussed below could be termed a second member, region, portion, or element without departing from the teachings of exemplary embodiments. For example, a first element could be termed a second element, and, similarly, a second element could be termed a first element, without departing from the scope of exemplary embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact" refers to direct contact, unless the context indicates otherwise.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing.

Figure 1B:
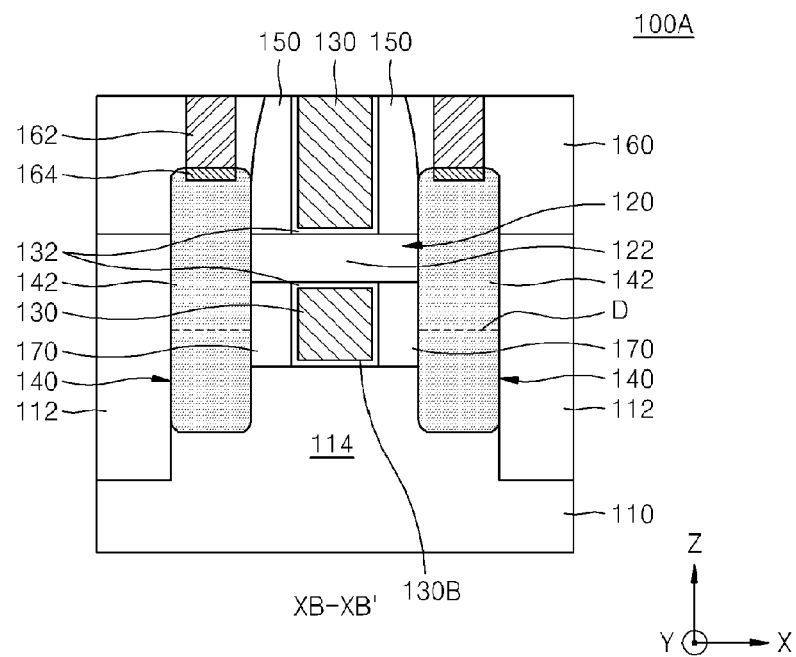
Figure 1C:
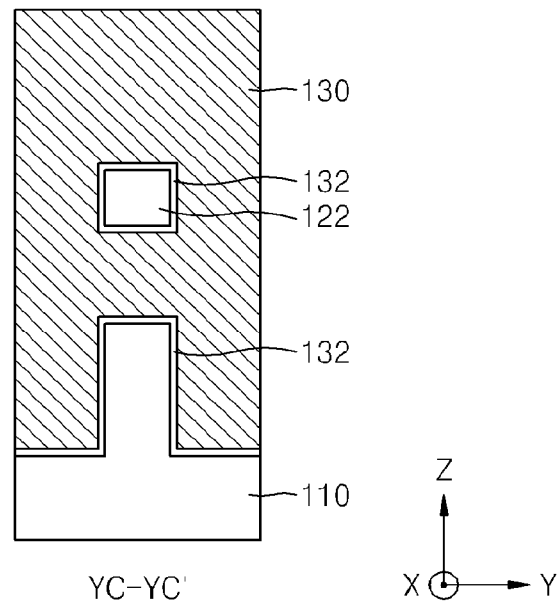
Figure 1D:
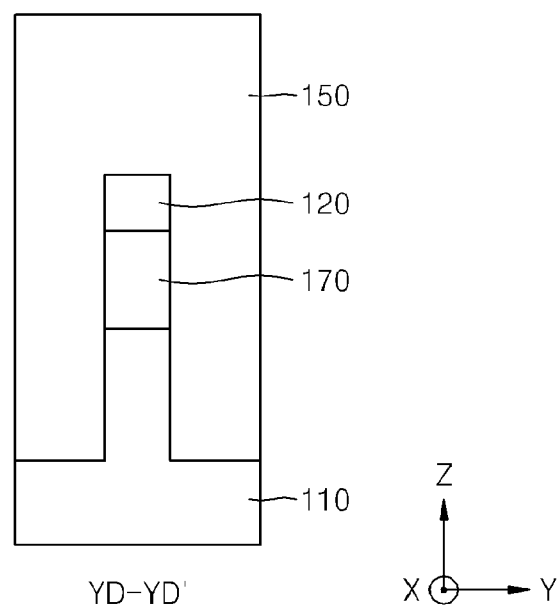

FIGS. 1A through 1D are views illustrating a semiconductor device 100A according to an embodiment. In detail, FIG. 1A is a plan view illustrating the semiconductor device 100A. FIG. 1B is a cross-sectional view taken along line XB-XB' of FIG. 1A. FIG. 1C is a cross-sectional view taken along line YC-YC' of FIG. 1A. FIG. 1D is a cross-sectional view taken along line YD-YD' of FIG. 1A.

Referring to FIGS. 1A through 1D, the semiconductor device 100A includes a substrate 110, a nanowire (e.g., a semiconductor layer) 120 that extends in a direction (X direction) parallel to a main surface extension direction of the substrate 110 to be spaced apart from the substrate 110, and a gate 130 that surrounds at least a part of the nanowire 120.

In an embodiment, the substrate 110 may be a silicon substrate. In an embodiment, the substrate 110 may constitute any one device selected from among, for example, a system large scale integration (LSI), a logic circuit, an image sensor such as a complementary metal-oxide-semiconductor (CMOS) imaging sensor (CIS), a flash memory, a memory device such as a dynamic random access memory (DRAM), a static random access memory (SRAM), an electrically erasable programmable read-only memory (EEPROM), a phase-change random access memory (PRAM), a magnetoresistive random-access memory (MRAM), or a resistive random access memory (RRAM), and a micro-electro-mechanical system (MEMS).

An active region 114 is defined by a device isolation film 112 in the substrate 110. A plurality of wells may be formed in the active region 114 of the substrate 110.

The nanowire 120 includes a channel region 122. The gate 130 surrounds at least a part of the channel region 122.

The nanowire 120 may be formed of, for example, a group IV semiconductor, a group IV-IV compound semiconductor, or a group III-V compound semiconductor. In an embodiment, the nanowire 120 may be formed of, for example, silicon (Si), germanium (Ge), or SiGe. Alternatively, the nanowire 120 may be formed of, for example, InGaAs, InAs, GaSb, InSb, or a combination thereof.

A gate dielectric film 132 is disposed between the channel region 122 and the gate 130.

In an embodiment, the gate dielectric film 132 may be, for example, a silicon oxide film, a silicon oxynitride film, a high-k film having a dielectric constant higher than that of a silicon oxide film, or a combination thereof. For example, the gate dielectric film 132 may be formed of, but is not limited to, $HfO_2$, HfSiO, HfSiON, HfTaO, HfTiO, HfZrO, zirconium oxide, aluminum oxide, $HfO_2$—$Al_2O_3$ alloy, or a combination thereof.

In an embodiment, the gate 130 may include, for example, doped polysilicon, a metal, or a combination thereof. For example, the gate 130 may be formed of, but is not limited to, aluminum (Al), copper (Cu), titanium (Ti), tantalum (Ta), tungsten (W), molybdenum (Mo), TaN, NiSi, CoSi, TiN, WN, TiAl, TiAlN, TaCN, TaC, TaSiN, or a combination thereof.

A pair of semiconductor layers 140 that extend to both end portions of the nanowire 120 in a direction (Z direction) perpendicular to a main surface of the substrate 110 are formed on the substrate 110. In an embodiment, the semiconductor layers 140 may be each formed of, but are not limited to, a SiGe film, a Ge film, a SiC film, or an InGaAs film.

The semiconductor layers 140 are semiconductor layers that are re-grown by using epitaxy from the substrate 110 and the nanowire 120. In an embodiment, the semiconductor layers 140 may be formed of a material that is different from those of the substrate 110 and the nanowire 120.

The semiconductor layers 140 respectively include source/drain regions 142. The source/drain regions 142 may be formed by implanting n-type impurity ions or p-type impurity ions into the semiconductor layers 140. The source/drain regions 142 may be formed to a depth D marked by a dashed line. For example, the source/drain regions 142 may be formed of, but are not limited to, a doped SiGe film, a doped Ge film, a doped SiC film, or a doped InGaAs film.

In an embodiment, the depth D may be a level higher than that of a bottom surface 130B of the gate 130 that is the closest to the substrate 110 as shown in FIG. 1B. However, the present embodiment is not limited thereto.

The source/drain regions 142 formed in the semiconductor layers 140 may contact the both end portions of the nanowire 120, and may extend to a level higher than that of the nanowire 120 in the direction (Z direction) perpendicular to the main surface of the substrate 110.

The both end portions of the nanowire 120 that are adjacent to the source/drain regions 142 are covered by outer insulating spacers 150 that cover side walls of the gate 130. The gate dielectric film 132 is also disposed between the gate 130 and the outer insulating spacers 150.

Parts of the source/drain regions 142 and the outer insulating spacers 150 are covered by an insulating film 160. The source/drain regions 142 are respectively connected to contacts 162 that pass through the insulating film 160. A metal silicide film 164 may be formed between the source/drain regions 142 and the contacts 162. Since the metal silicide film 164 may be formed on surfaces of the source/drain regions 142, resistance of the source/drain regions 142 and resistance of the contacts 162 may be reduced. In an embodiment, the metal silicide film 164 may be, but is not limited to, a cobalt silicide film. In an embodiment, the metal silicide film 164 may be omitted.

A pair of inner insulating spacers 170 are formed between the substrate 110 and the nanowire 120. The inner insulating spacers 170 are disposed between the gate 130 and the source/drain regions 140 and between the substrate 110 and the nanowire 120.

The gate dielectric film 132 extends from a surface of the channel region 122 of the nanowire 120 to surfaces of side walls of the inner insulating spacers 170 so as to be disposed between the gate 130 and the inner insulating spacers 170 and between the substrate 110 and the nanowire 120.

In an embodiment, the inner insulating spacers 170 may be formed of a material that is different from a material of the gate dielectric film 132. In an embodiment, the inner insulating spacers 170 may be formed of a material that has a dielectric constant lower than a dielectric constant of a material of the gate dielectric film 132. In an embodiment, the inner insulating spacers 170 may be formed of, for example, an oxide of a group IV semiconductor, an oxide of a group IV-IV compound semiconductor, an oxide of a group III-V compound semiconductor, or a silicon oxide. For example, the inner insulating spacers 170 may be formed of, but are not limited to, a SiGe oxide, an InP oxide, or a silicon oxide.

The outer insulating spacers 150 and the inner insulating spacers 170 are formed at different levels on the substrate 110 in the direction (Z direction) perpendicular to the main surface extension direction of the substrate 110 to vertically overlap with each other. In an embodiment, the inner insulating spacers 170 may be formed of a material that is different from a material of the outer insulating spacers 150. In an embodiment, the inner insulating spacers 170 may be formed of a material that has a dielectric constant lower than a dielectric constant of a material of the outer insulating spacers 150. The outer insulating spacers 150 surround a portion of the nanowire 120 and a portion of the inner insulating spacers 170 as shown in FIG. 1D.

The semiconductor device 100A may constitute a transistor. In an embodiment, when an N-type well is formed in the active region 114 of the substrate 110 and P-type impurities are doped into the source/drain regions 140, the semiconductor device 110A may constitute a P-type metal-oxide-semiconductor (PMOS) transistor. Alternatively, when a P-type well is formed in the active region 114 of the substrate 110 and N-type impurities are doped into the source/drain region 140, the semiconductor device 110A may constitute an N-type metal-oxide-semiconductor (NMOS) transistor.

A carrier mobility of a MOS transistor may greatly affect power consumption and switching performance of a device. A switching speed may be increased and the device may be operated at a low voltage by increasing the carrier mobility, thereby reducing power consumption. In an embodiment, in order to increase a carrier mobility in the semiconductor device 100A constituting a MOS transistor, the channel region 122 of the nanowire 120 may have a strained channel.

In an embodiment, when the semiconductor device 100A constitutes a PMOS transistor, in order to provide the nanowire 120 including a strained channel, the nanowire 120 may be formed of Si, and the source/drain regions 142 that are connected to both ends of the nanowire 120 may be formed of doped SiGe or doped Ge. Alternatively, when the semiconductor device 100A constitutes a PMOS transistor, in order to provide the nanowire 120 including a strained channel, the nanowire 120 may be formed of Ge, and the source/drain regions 142 may be formed of SiGe. Alternatively, when the semiconductor device 100A constitutes an NMOS transistor, in order to provide the nanowire 120 including a strained channel, the nanowire 120 may be formed of Si, and the source/drain regions 142 may be formed of doped SiC.

In the semiconductor device 100A described with reference to FIGS. 1A through 1D, the source/drain regions 142 are respectively formed in the semiconductor layers 140 that are re-grown from the substrate 110 and the nanowire 120. The gate 130 is formed to be spaced apart in the main surface extension direction (X direction) of the substrate 110 from the source/drain regions 142. Accordingly, a gate parasitic capacitance and a leakage current between the gate 130 and the source/drain regions 142 may be suppressed. Also, since a material of the semiconductor layer 140 including the source/drain regions 142 has a lattice constant that is different from a lattice constant of a material of the nanowire 120, the source/drain regions 142 may act as a stressor for applying a compressive or tensile stress to the channel region 122.

In an embodiment, not only the gate dielectric film 132 but also the inner insulating spacers 170 are disposed between the gate 130 and the source/drain regions 142. The inner insulating spacers 170 may more effectively suppress a gate parasitic capacitance and a current between the gate 130 and the source/drain regions 142. Accordingly, the semiconductor device 100A including the inner insulating spacers 170 disposed between the gate dielectric film 132 and the source/drain regions 142 may improve an operation speed of the semiconductor device 100A.

Figure 2:
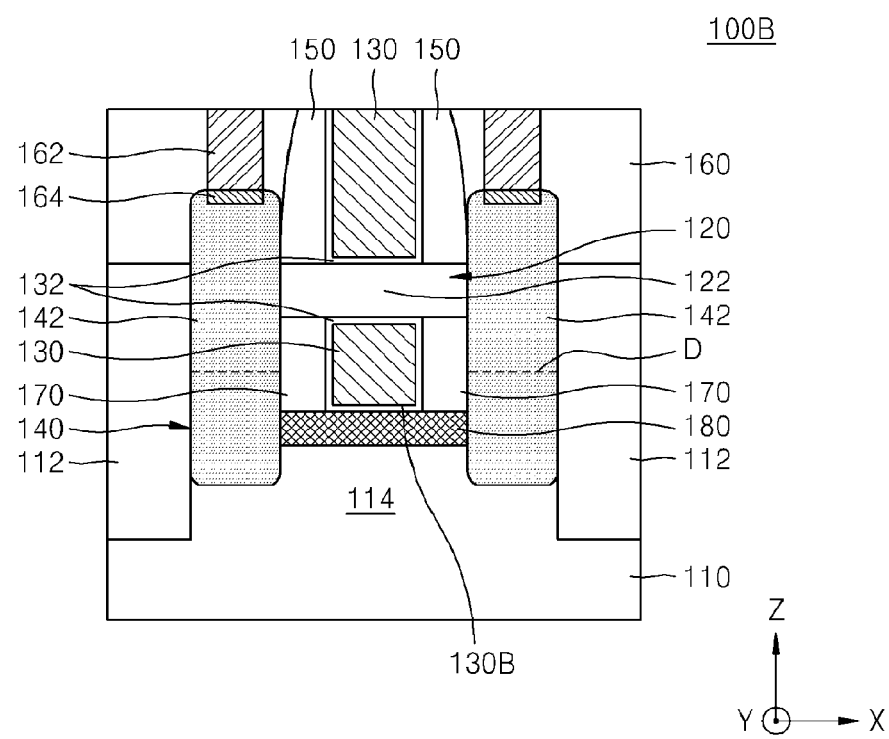
FIG. 2 is a cross-sectional view illustrating a semiconductor device according to another embodiment.

FIG. 2 is a cross-sectional view illustrating a semiconductor device 100B according to another embodiment. In FIG. 2, the same elements as those in FIGS. 1A through 1D are denoted by the same reference numerals, and detailed explanation thereof will not be given in order to avoid a repeated explanation.

Referring to FIG. 2, the semiconductor device 100B includes a channel isolation region 180 that is disposed between the substrate 110 and the gate 130 and extends in the main surface extension direction (X direction) of the substrate 110.

In an embodiment, the channel isolation region 180 may be formed by implanting impurity ions having a conductivity type that is opposite to a conductivity type of impurity ions included in the source/drain regions 142. Since the channel isolation region 180 is formed on a surface of the substrate 110 facing the bottom surface 130B of the gate 130, a channel may be prevented from being formed on the surface of the substrate 110 facing the bottom surface 130B of the gate 130. Accordingly, short-channel effect in the semiconductor device 100B may be minimized.

Figure 10A:
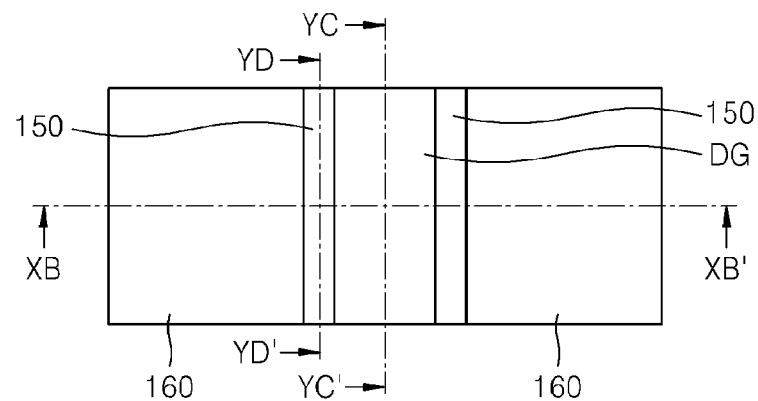
Figure 10B:
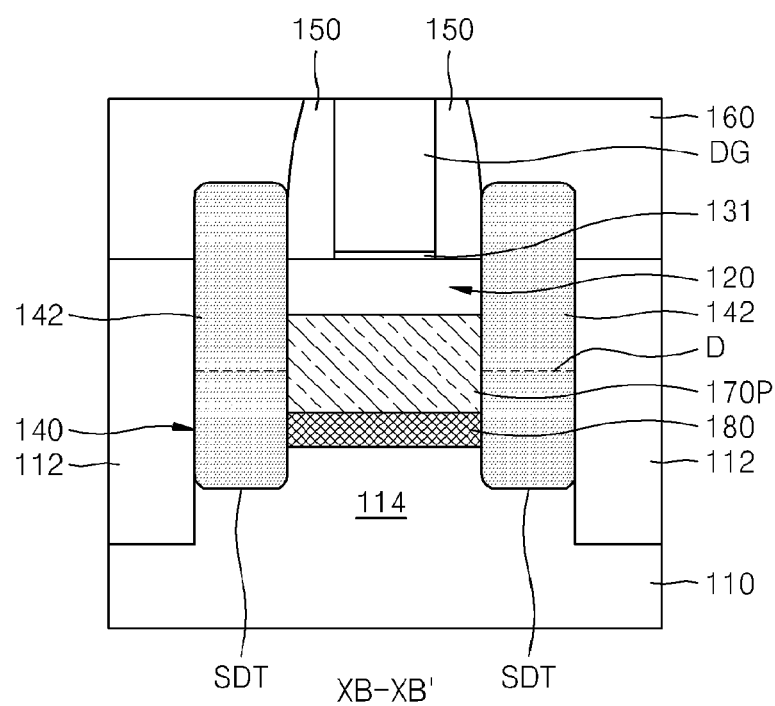
Figure 10C:
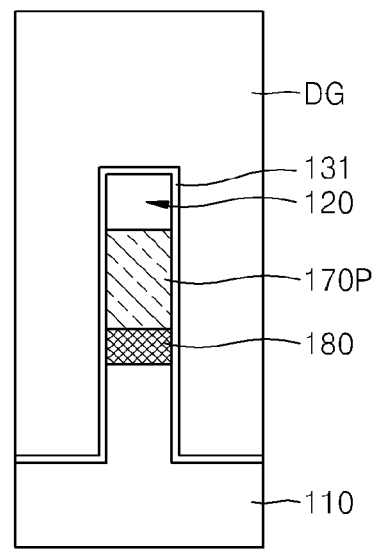
Figure 10D:
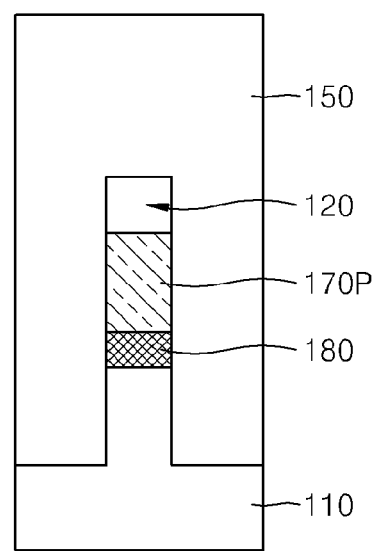
Figure 11A:
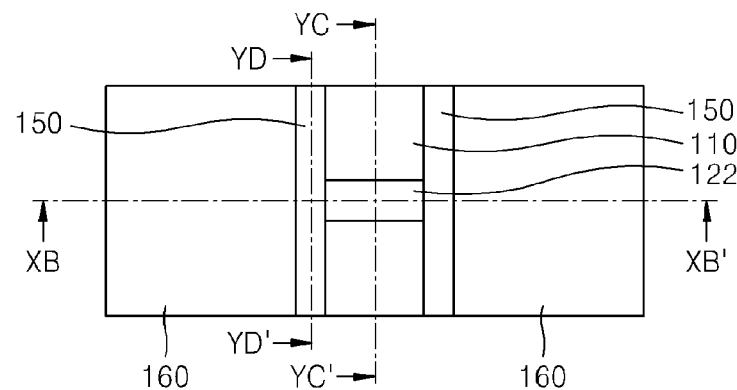
Figure 11B:
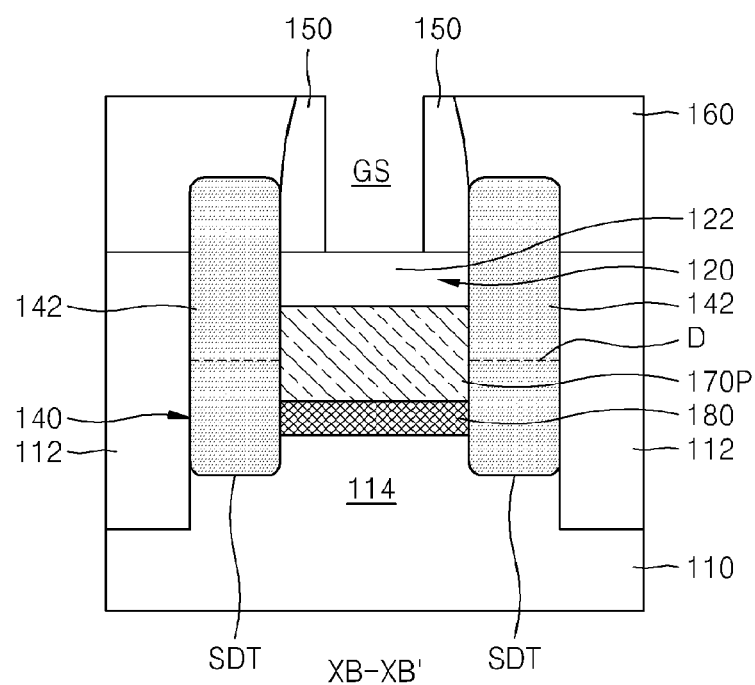
Figure 11C:
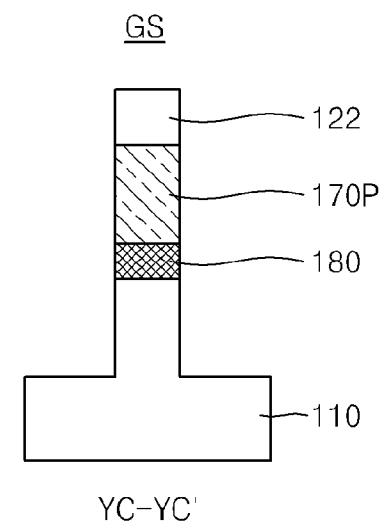
Figure 11D:
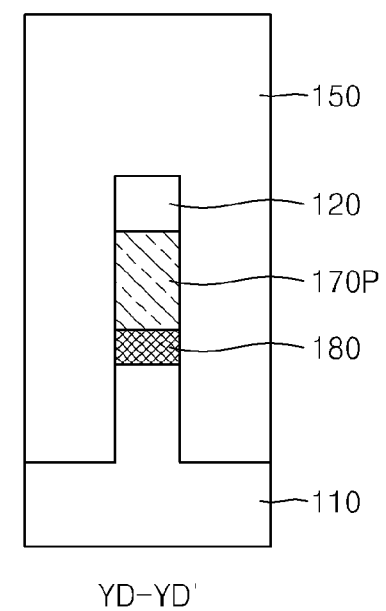
Figure 12A:
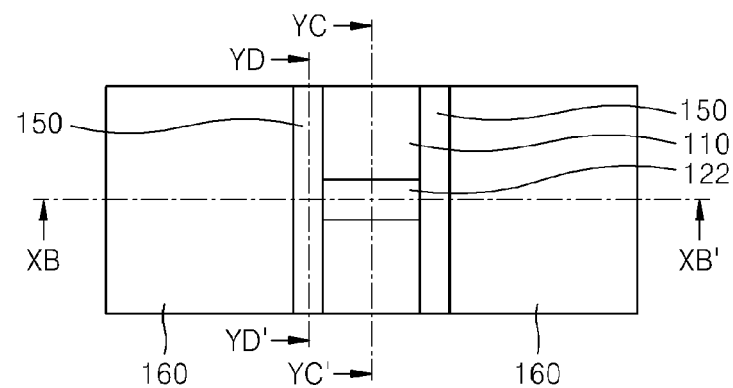
Figure 12B:
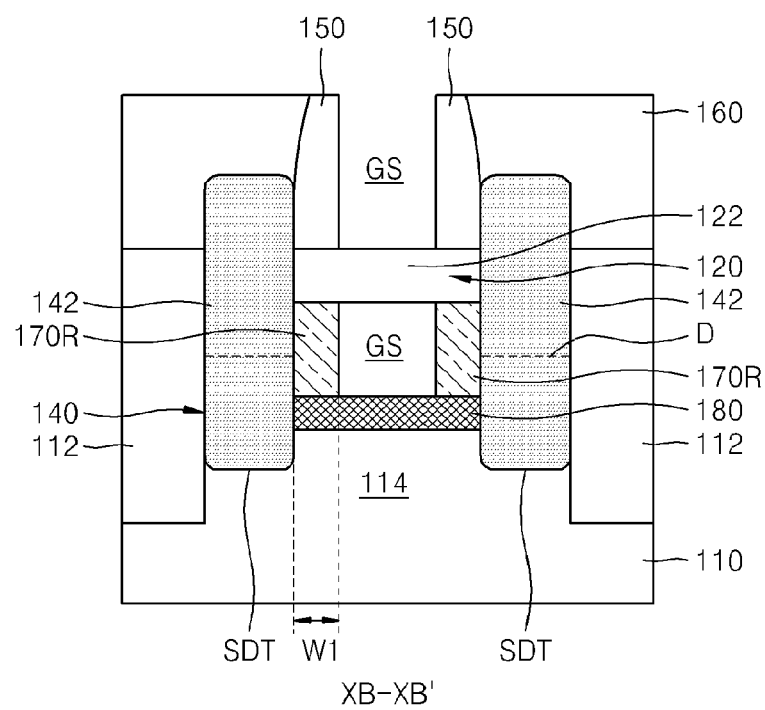
Figure 12C:
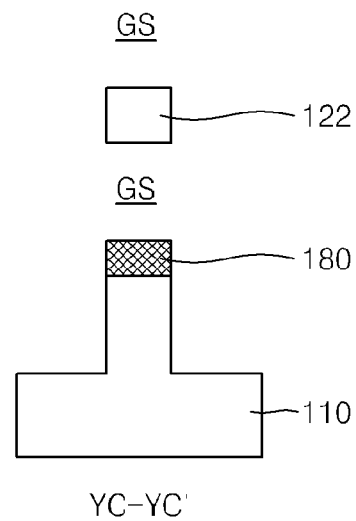
Figure 12D:
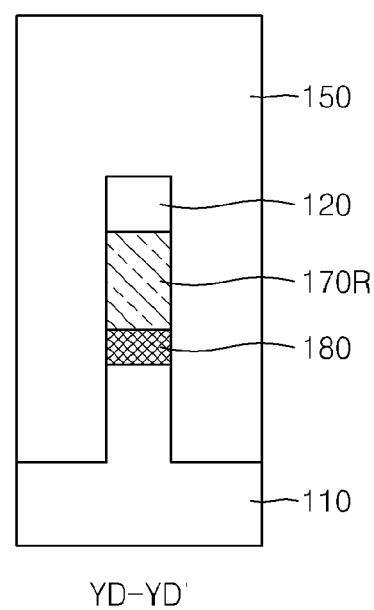
Figure 13A:
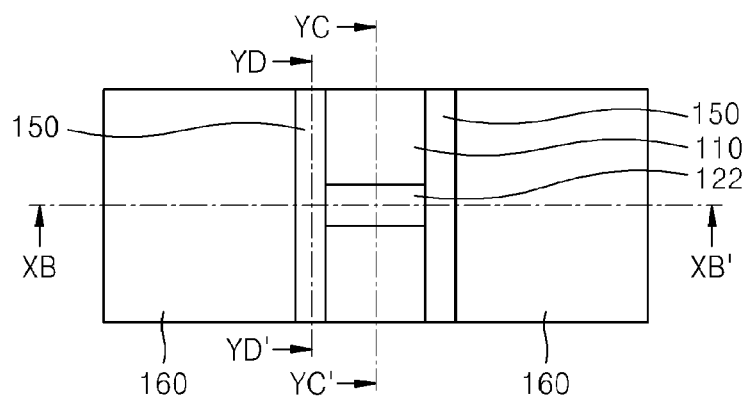
Figure 13B:
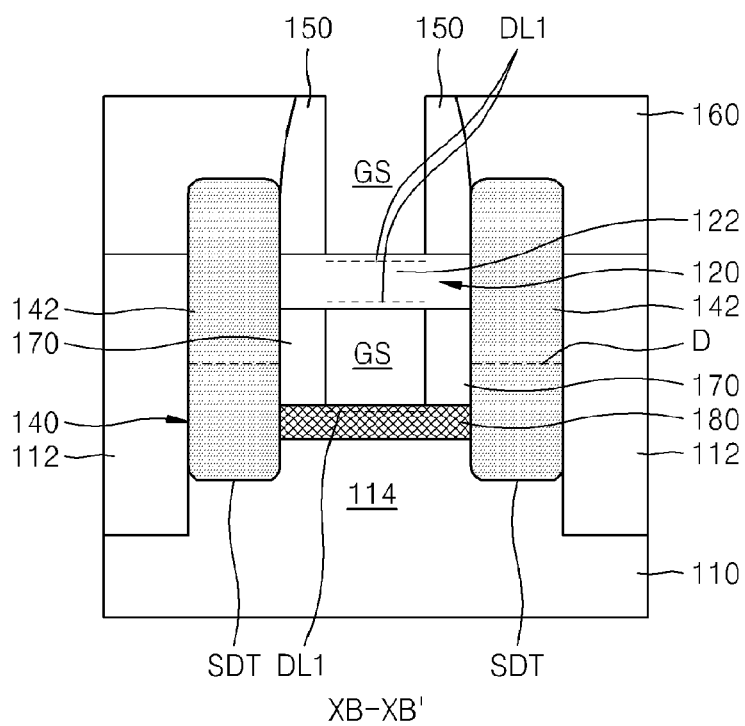
Figure 13C:
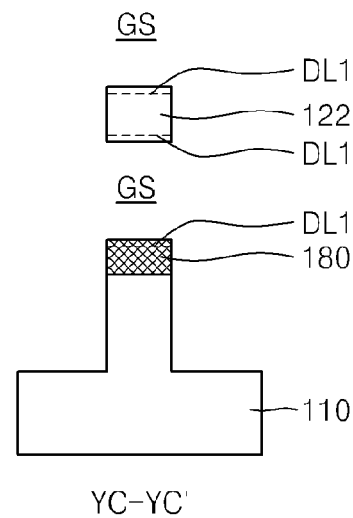
Figure 13D:
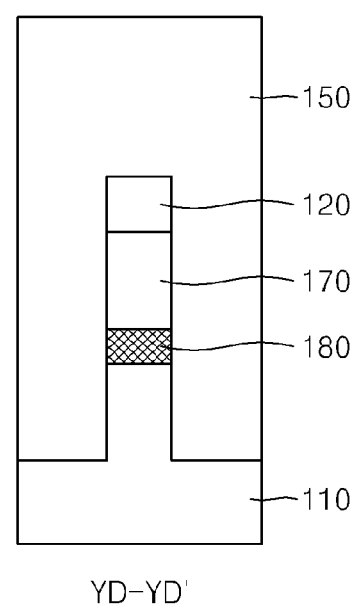
Figure 14A:
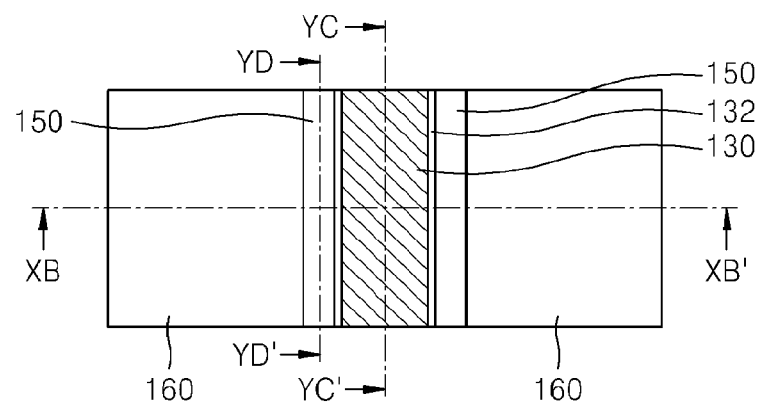
Figure 14B:
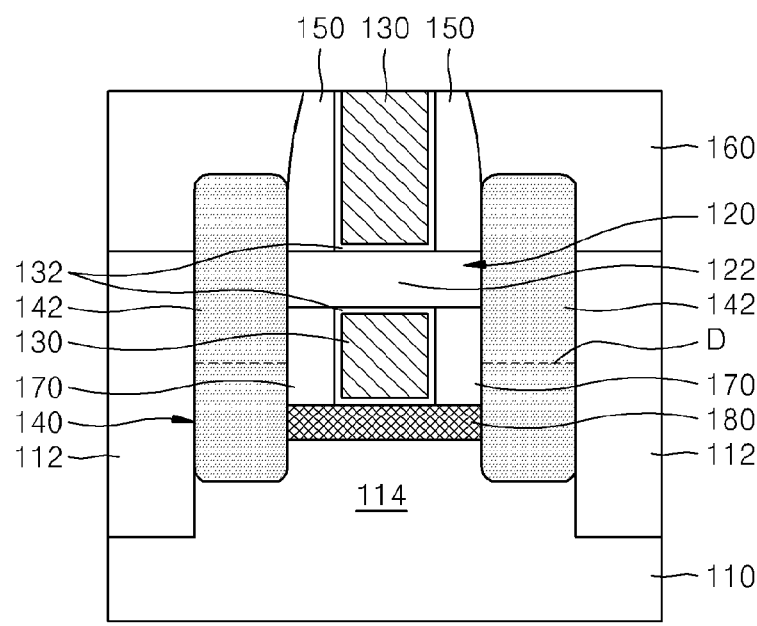
Figure 14C:
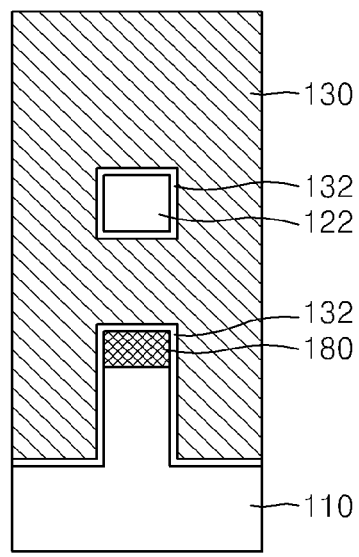
Figure 14D:
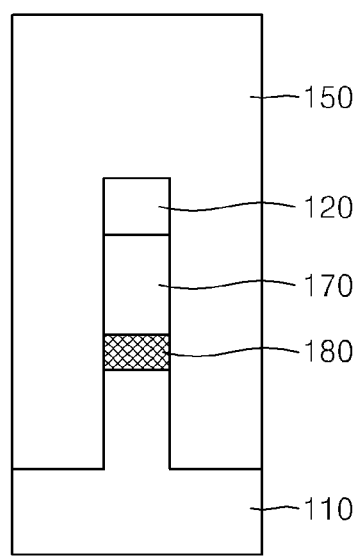

FIGS. 3A through 14D are views according to a process order for explaining a method of manufacturing a semiconductor device, according to example embodiments. A method of manufacturing the semiconductor device 100B of FIG. 2 will be exemplarily explained. From among FIGS. 3A through 14D, FIGS. 3A, 4A, ..., 14A are plan views for explaining each process order, FIGS. 3B, 4B, ..., and 14B are cross-sectional views taken along line XB-XB' of FIGS. 3A, 4A, ..., and 14A, respectively, FIGS. 10C, 11C, ..., and 14C are cross-sectional views taken along line YC-YC' of FIGS. 10A, 11A, ..., and 14A, respectively, and FIGS. 10D, 11D, ..., and 14D are cross-sectional views taken along line YD-YD' of FIGS. 10A, 11A, ..., and 14A, respectively. In FIGS. 3A through 14D, the same elements as those in FIGS. 1A through 1D and 2 are denoted by the same reference numerals, and a detailed explanation thereof will not be given in order to avoid a repeated explanation.

Figure 3A:
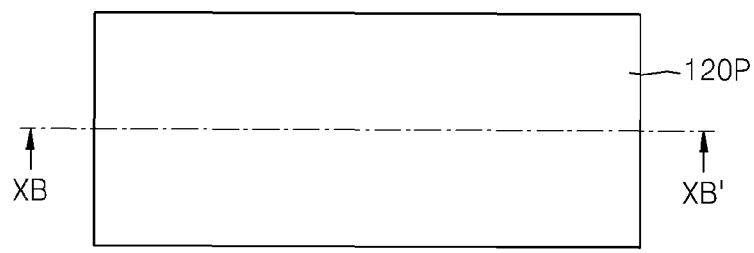
FIGS. 3A through 14D are views according to a process order for explaining a method of manufacturing a semiconductor device according to example embodiments, FIGS. 3A, 4A, . . . , and 14A being plan views for explaining each process order, FIGS. 3B, 4B, . . . , and 14B being cross-sectional views taken along line XB-XB' of FIGS. 3A, 4A, and 14A, respectively, FIGS. 10C, 11C, . . . , and 14C being cross-sectional views taken along line YC-YC' of FIGS. 10A, 11A, . . . , and 14A, respectively, and FIGS. 10D, 11D, . . . , and 14D being cross-sectional views taken along line YD-YD' of FIGS. 10A, 11A, . . . , and 14A, respectively.
Figure 3B:
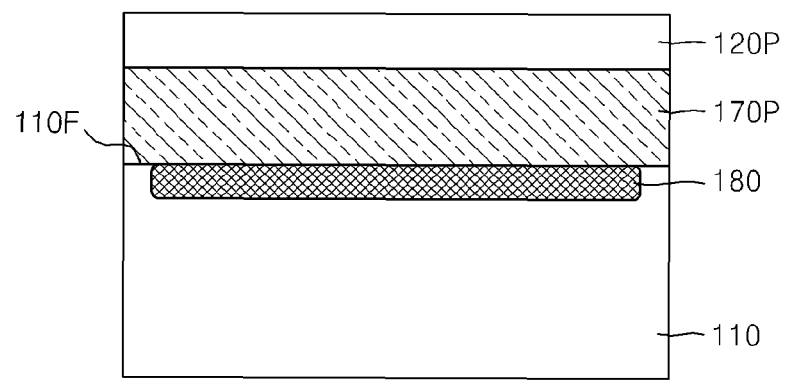

Referring to FIGS. 3A and 3B, in one embodiment, the channel isolation region 180 is formed by implanting impurity ions at a high dose into the substrate 110 from a main surface 110F of the substrate 110.

In an embodiment, the substrate 10 may be formed of Si.

In one embodiment, the channel isolation region 180 is doped with impurities that have a channel type opposite to a channel type of a transistor that is to be formed in the active region 114. Since the channel isolation region 180 is formed, an undesired channel may be prevented from being formed on a surface of the substrate 110.

A sacrificial layer 170P and a channel semiconductor layer 120P are sequentially formed on the substrate 110 on which the channel isolation region 180 is formed.

The sacrificial layer 170P and the channel semiconductor layer 120P may be formed of single crystalline semiconductor materials having etch selectivities with respect to each other.

In an embodiment, the sacrificial layer 170P and the channel semiconductor layer 120P may be formed of, for example, a group IV semiconductor, a group IV-IV compound semiconductor, or a group III-V compound semiconductor, and the sacrificial layer 170P and the channel semiconductor layer 120P are formed of different materials. For example, the sacrificial layer 170P may be formed of SiGe. For example, the channel semiconductor layer 120P may be formed of single crystalline silicon.

In an embodiment, each of the sacrificial layer 170P and the channel semiconductor layer 120P may be formed to have a thickness ranging from, but is not limited to, about 200 Å to about 500 Å.

The sacrificial layer 170P and the channel semiconductor layer 120P may be formed by using epitaxy. Chemical vapor deposition (CVD) such as vapor-phase epitaxy (VPE) or ultra-high vacuum chemical vapor deposition (UHV-CVD), molecular beam epitaxy, or a combination thereof may be used as the epitaxy. During the epitaxy, a liquid or gaseous precursor may be used as a precursor necessary to form the sacrificial layer 170P and the channel semiconductor layer 120P.

Figure 4A:
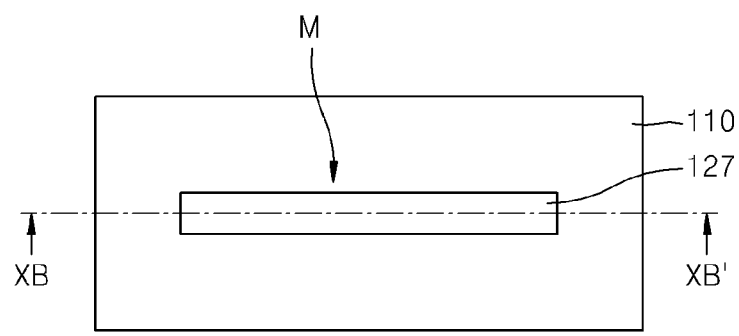
Figure 4B:
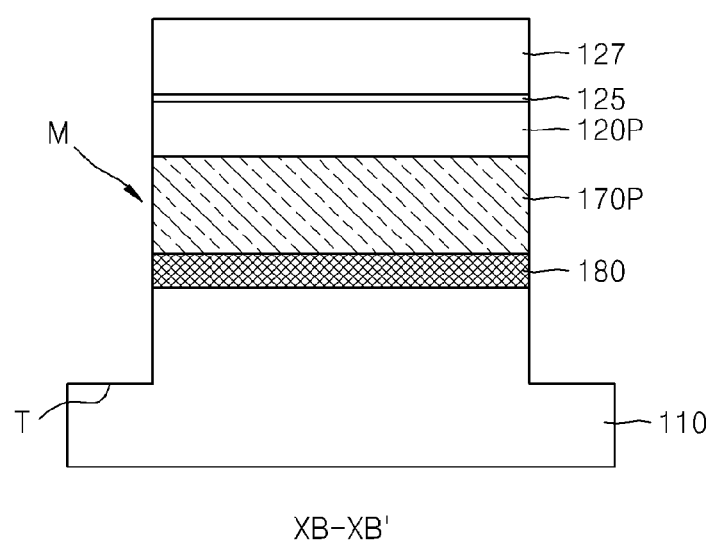

Referring to FIGS. 4A and 4B, a pad oxide film 125 and a mask pattern 127 are formed on the channel semiconductor layer 120P, and then a trench T is formed by sequentially etching parts of the pad oxide film 125, the channel semiconductor layer 120P, the sacrificial layer 170P, and the substrate 110 by using the mask pattern 127 as an etching mask. A mesa structure M including parts of the substrate 110, the sacrificial layer 170P, and the channel semiconductor layer 120P is defined by the trench T.

In an embodiment, in order to form the trench T, dry etching may be used. For example, parts of the pad oxide film 125, the channel semiconductor layer 120P, the sacrificial layer 170P, and the substrate 110 may be sequentially etched by using reactive ion etching (RIE).

Figure 5A:
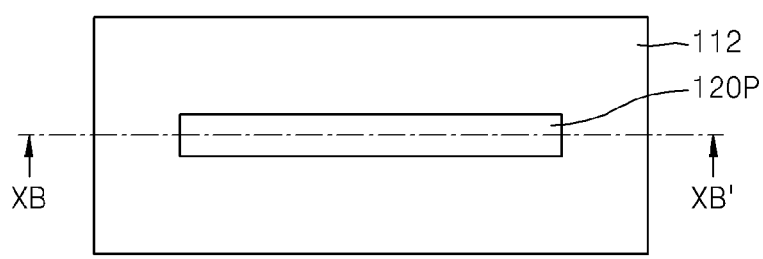
Figure 5B:
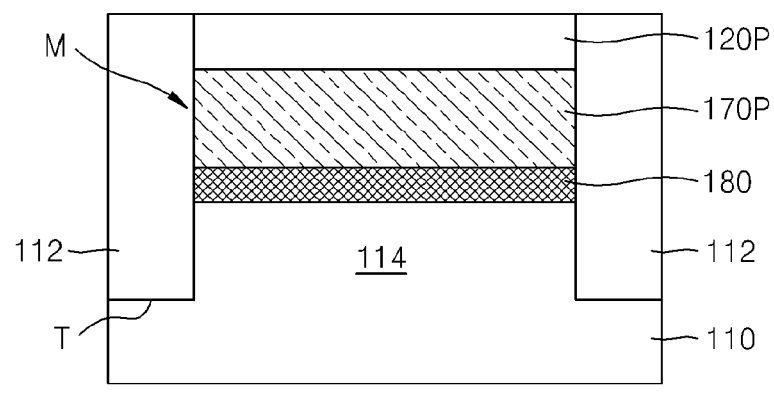

Referring to FIGS. 5A and 5B, the pad oxide film 125 and the mask pattern 127 (see FIGS. 4A and 4B) are removed, and then the device isolation film 112 having a planarized top surface is formed by filling an insulating material in the trench T. The device isolation film 112 may be, for example, an oxide film, a nitride film, or a combination thereof.

The active region 114 may be defined in the substrate 110 by the device isolation film 112. The active region 114 may include a well into which a predetermined type of impurity ions are implanted. When a PMOS transistor is formed in the active region 114, the well is an N-type well. Alternatively, when an NMOS transistor is formed in the active region 114, the well is a P-type well.

Figure 6A:
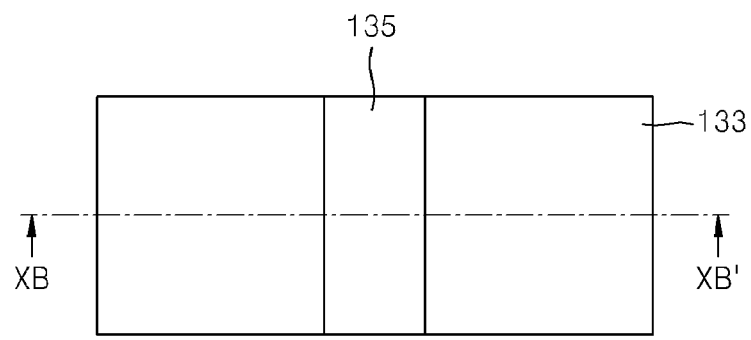
Figure 6B:
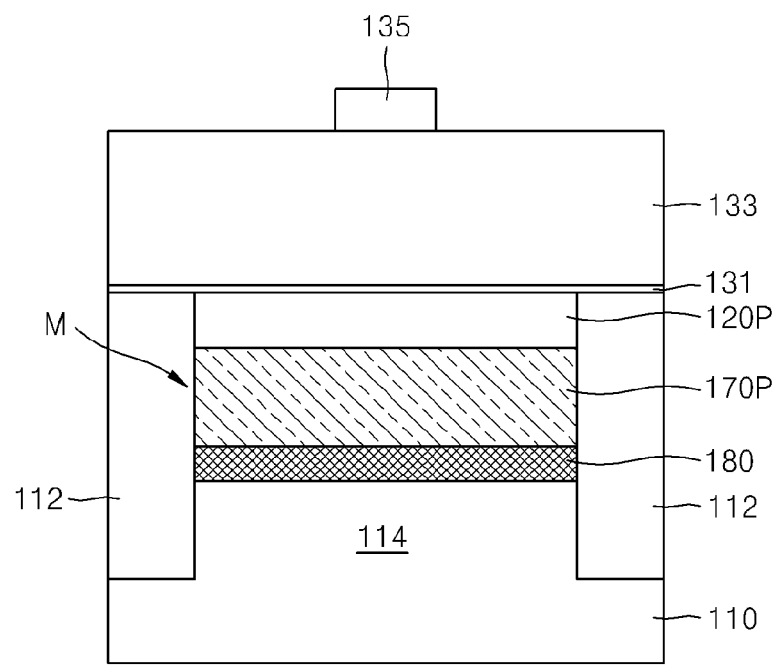

Referring to FIGS. 6A and 6B, a dummy gate layer 133 that covers top surfaces of the device isolation film 112 and the mesa structure M is formed, and a capping pattern 135 that covers a portion of a top surface of the dummy gate layer 133 corresponding to a gate region is formed.

In order to form the capping pattern 135, photolithography may be used.

In an embodiment, the dummy gate layer 133 may be formed of polysilicon. The capping pattern 135 may be formed of a silicon nitride film.

In an embodiment, the dummy gate layer 133 may be formed to have a thickness ranging from, for example, about 100 Å to about 3000 Å.

An etch-stop film 131 is disposed between the channel semiconductor layer 120P and the dummy gate layer 133. The etch-stop film 131 may be used as a film for protecting a portion of a lower structure on which an active pattern is to be formed when the dummy gate layer 133 is etched, for example, the channel semiconductor layer 120P. The etch-stop film 131 may be formed to have a thickness ranging from about 100 Å to about 200 Å. The etch-stop film 131 may be formed of a material that has an etch selectivity with respect to the dummy gate layer 133. For example, the etch-stop film 131 may be formed as at least one selected from, but is not limited to, a thermal oxide film, a silicon oxide film, and a silicon nitride film. Alternatively, the etch-stop film 131 may be omitted.

Figure 7A:
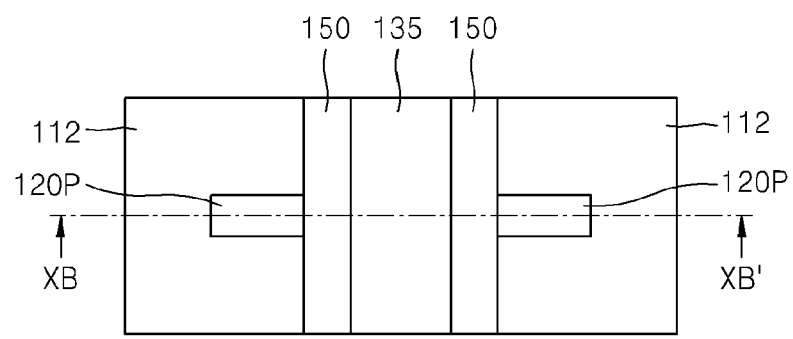
Figure 7B:
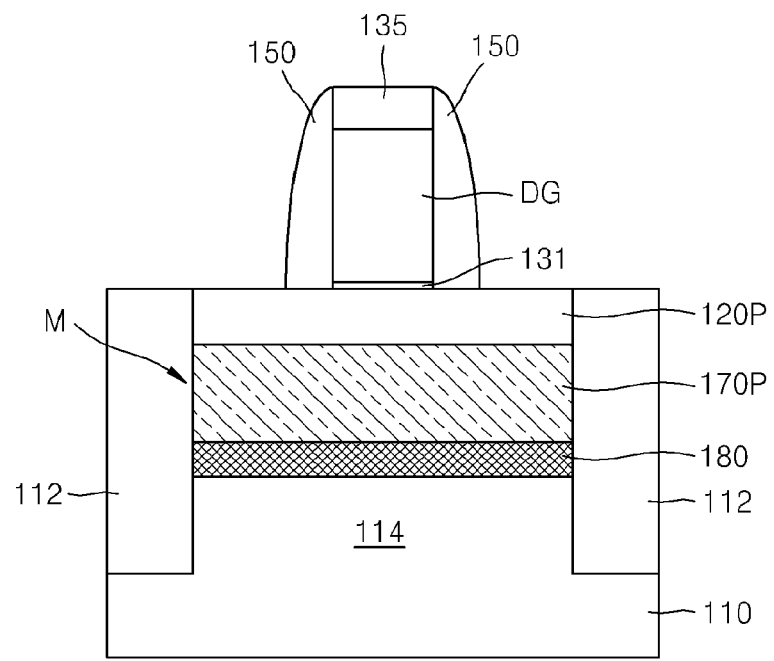

Referring to FIGS. 7A and 7B, a dummy gate structure DG is formed by etching the dummy gate layer 133 and the etch-stop film 131 by using the capping pattern 135 as an etching mask. The etch-stop film 131 may remain only under the dummy gate structure DG. Next, the outer insulating spacers 150 that cover both side walls of the capping pattern 135 and the dummy gate structure DG are formed.

Figure 8A:
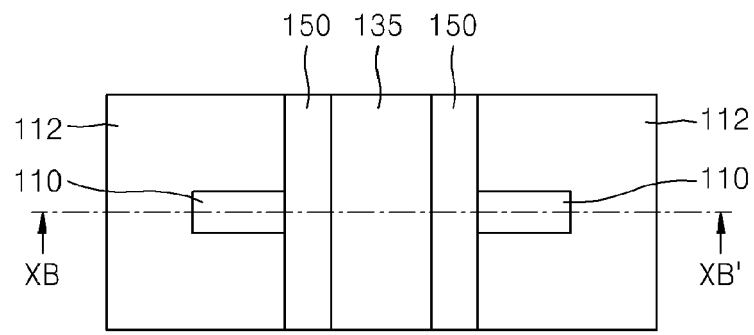
Figure 8B:
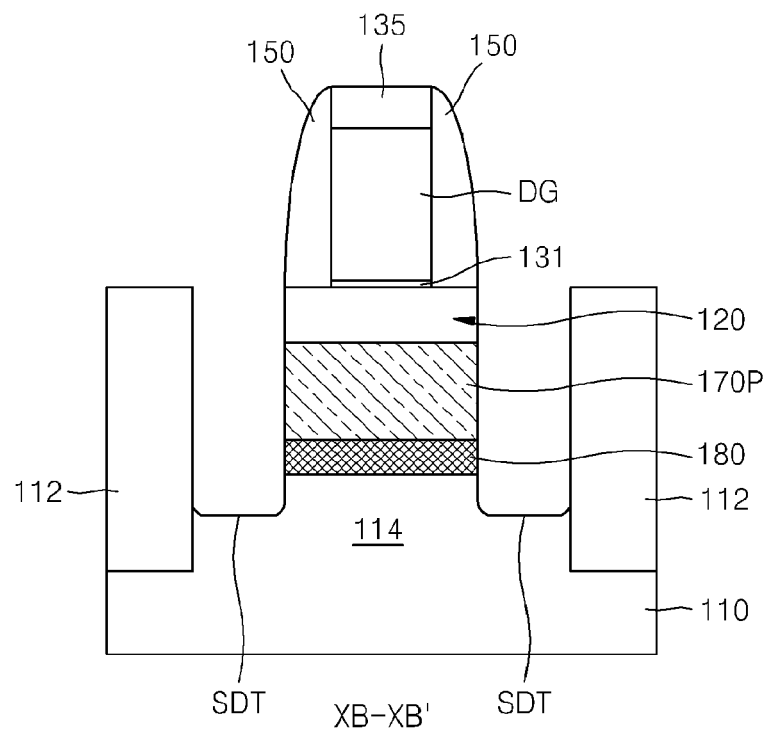

Referring to FIGS. 8A and 8B, a pair of source/drain trenches SDT that are disposed at both sides of the dummy gate structure DG are formed by etching a part of the mesa structure M (see FIGS. 6A and 6B), that is, parts of the channel semiconductor layer 120P, the sacrificial layer 170P, the channel isolation region 180, and the substrate 110, from a portion of the channel semiconductor layer 120P which is exposed to the outside by using the capping pattern 135, the outer insulating spacers 150, and the device isolation film 112 as an etching mask. In an embodiment, the source/drain trenches SDT may have cross-sectional shapes that are self-aligned by at least one of the outer insulating spacers 150 and the device isolation film 112.

In an embodiment, in order to form the source/drain trenches SDT, a part of the mesa structure M may be etched by using dry etching. For example, in order to form a part of the mesa structure M, that is, parts of the channel semiconductor layer 120P, the sacrificial layer 170P, the channel isolation region 180, and the substrate 110, RIE may be used.

The source/drain trenches SDT may be formed to have a depth greater than a depth of the channel isolation region 180 in the substrate 110. Since the source/drain trenches SDT are formed, the nanowire 120 that is a part remaining after a part of the channel semiconductor layer 120P is removed may be formed.

The substrate 110, the channel isolation region 180, the sacrificial layer 170P, and the nanowire 120 may be exposed in the source/drain trenches SDT.

Figure 9A:
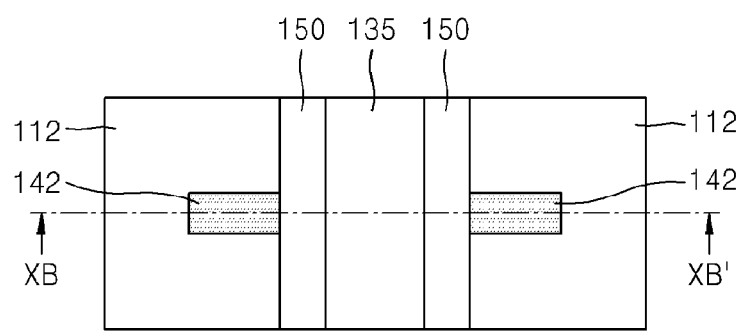
Figure 9B:
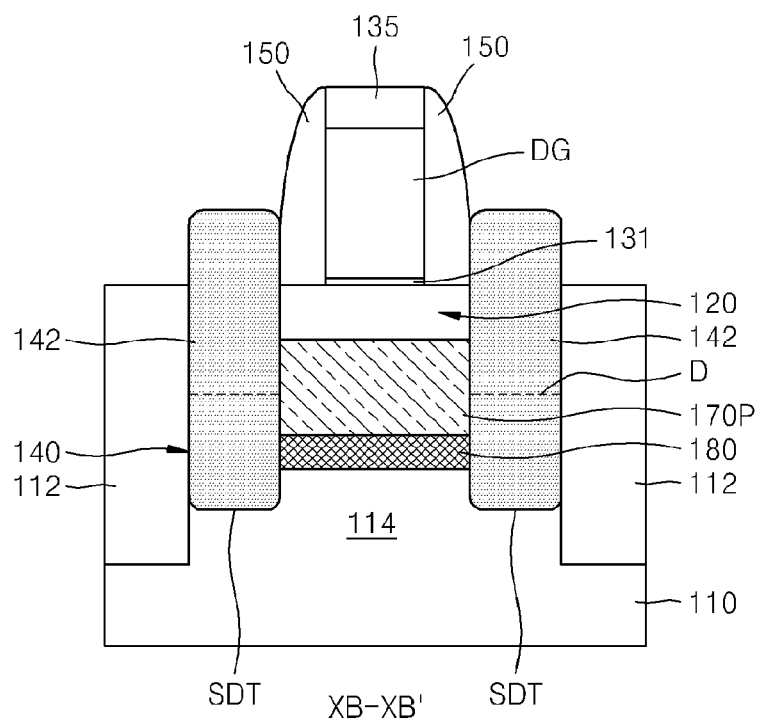

Referring to FIGS. 9A and 9B, semiconductor layers 140 that fill the source/drain trenches SDT are formed by re-growing a single crystalline film from the substrate 110 and the nanowire 120 in the source/drain trenches SDT by using selective epitaxy.

The semiconductor layers 140 may be formed from bottom surfaces of the source/drain trenches SDT to contact both end portions of the nanowire 120. As shown in FIG. 9B, a distance from the substrate 110 to top surfaces of the semiconductor layers 140 may be greater than a distance from the substrate 110 to a top surface of the nanowire 120.

In an embodiment, when a PMOS transistor is to be formed on the substrate 110, the semiconductor layers 140 may be formed of, for example, a SiGe film or a Ge film. When the semiconductor layers 140 are formed of a SiGe film, the semiconductor layers 140 may be formed to have a Ge concentration gradient such that a Ge concentration decreases toward the substrate 110 and increases away from the substrate 110 in the semiconductor layers 140.

Alternatively, when an NMOS transistor is to be formed on the substrate 110, the semiconductor layers 140 may be formed of, for example, a SiC film.

Next, the source/drain regions 142 having the depth D marked by a dashed line are formed in the semiconductor layers 140.

The source/drain regions 142 may be formed by implanting N-type or P-type impurity ions according to a channel type of a transistor that is to be formed on the substrate 110.

In the method of manufacturing the semiconductor device of the present embodiment, impurity ions may be constantly doped at a relatively high dose in situ during a re-growth process for forming the semiconductor layers 140. Accordingly, resistance of the source/drain regions 142 may be greatly reduced.

Referring to FIGS. 10A through 10D, the insulating film 160 that covers the dummy gate structure DG, the capping pattern 135, the outer insulating spacers 150, and the device isolation film 112 is formed on a resultant structure of FIGS. 9A and 9B including the source/drain regions 142, and then the capping pattern 135, parts of the outer insulating spacers 150, and a part of the insulating film 160 are removed by using planarization and/or etch-back to expose the dummy gate structure DG to the outside.

Referring to FIGS. 11A through 11D, the dummy gate structure DG that is exposed to the outside and the etch-stop film 131 are removed, to form a gate space GS between the outer insulating spacers 150.

The channel region 122 of the nanowire 120 is exposed through the gate space GS.

In an embodiment, in order to remove the dummy gate structure DG and the etch-stop film 131, an etching process using an etch selectivity between films around the etch-stop film 131 and the dummy gate structure DG, in particular, between the outer insulating spacers 150, the nanowire 120, and the substrate 110, may be used.

Referring to FIGS. 12A through 12D, the gate space GS is extended to a space between the substrate 110 and the nanowire 120 by selectively removing a portion of the sacrificial layer 170P which is exposed through the gate space GS.

While a portion of the sacrificial layer 170P which is exposed through the gate space GS is removed, portions of the sacrificial layer 170P which are surrounded by the outer insulating spacers 150 may be protected by the outer insulating spacers 150 without being removed, and thus may remain as a residual sacrificial layer 170R. In an embodiment, the amount or a width W1 of the residual sacrificial layer 170R that finally remains may be controlled by adjusting an etching time of the sacrificial layer 170P.

In order to etch the sacrificial layer 170P, an etching process using an etch selectivity with respect to the nanowire 120 is used. In an embodiment, in order to selectively remove a portion of the sacrificial layer 170P which is exposed through the gate space GS, wet etching or isotropic dry etching may be used.

For example, when the sacrificial layer 170P is formed of SiGe and the nanowire 120 is formed of Si, in order to selectively remove an exposed portion of the sacrificial layer 170P while suppressing the nanowire 120 from being etched, an etchant whose SiGe selective etch rate with respect to Si is sufficiently high may be used. For example, an etchant including hydrogen peroxide ($H_2O_2$), hydrofluoric acid (HF), and acetic acid ($CH_3COOH$), an etchant including ammonium hydroxide ($NH_4OH$), hydrogen peroxide ($H_2O_2$), and deionized water ($H_2O$), an etchant including peracetic acid, or a combination thereof.

For example, when a process of forming the source/drain trenches SDT and a process of forming the semiconductor layers 140 of FIGS. 8A through 9B are omitted, the source/drain regions 142 may be formed in the mesa structure M through a surface of the mesa structure M of FIGS. 7A and 7B which is exposed between the outer insulating spacers 150 and the device isolation film 112. For example, the gate space GS between the substrate 110 and the nanowire 120 may be extended to the source/drain regions 142 due to over-etching of the sacrificial layer 170P while a portion of the sacrificial layer 170P which is exposed through the gate space GS is removed. For example, a gate parasitic capacitance and a leakage current between the source/drain regions 142 and the gate 130 that is formed in a subsequent process may be increased.

However, in the method of manufacturing the semiconductor device of the present embodiment, the semiconductor layers 140 are formed by being re-grown from the substrate 110 and the nanowire 120, and the source/drain regions 142 are formed on the semiconductor layers 140. Also, the residual sacrificial layer 170R of the sacrificial layer 170P which is surrounded by the outer insulating spacers 150 remains on a side wall of the semiconductor layers 140. Accordingly, the gate space GS between the substrate 110 and the nanowire 120 may be suppressed from being extended to the source/drain regions 142 while a portion of the sacrificial layer 170P which is exposed through the gate space GS is removed. Accordingly, the gate parasitic capacitance and the leakage current between the gate 130 and the source/drain regions 142 may be effectively suppressed.

Referring to FIGS. 13A through 13D, the inner insulating spacers 170 are formed by oxidizing the residual sacrificial layer 170R that remains between the substrate 110 and the nanowire 120.

In order to form the inner insulating spacers 170, the substrate 110 on which the residual sacrificial layer 170R remains may be maintained for a predetermined period of time, for example, for about 1 minute to about 50 minutes, in an oxidizing atmosphere. An oxygen ($O_2$) gas may be used as an oxidizing gas. The oxidizing atmosphere may be maintained at a temperature ranging from about 400° C. to about 700° C. For example, when the residual sacrificial layer 170R is formed of SiGe and the nanowire 120 is formed of Si, the substrate 110 may be placed in an oxidation chamber that is maintained at a temperature of about 600° C., and may be maintained for about 30 minutes by supplying an $O_2$ gas to the substrate 110. For example, an oxidation rate of the residual sacrificial layer 170R formed of SiGe may be much higher than an oxidation rate of each of the nanowire 120 and the substrate 110. Accordingly, while the residual sacrificial layer 170R is completely oxidized into a SiGe oxide, a relatively thin surface oxide film may be formed around a portion marked by a dashed line DL1 of FIGS. 13B and 13C from an exposed surface of the channel isolation region 180 on which the nanowire 120 and the substrate 110 are formed. For example, since an oxidation rate of each of the nanowire 120 and the substrate 110 is much lower than an oxidation rate of the residual sacrificial layer 170R, a thickness of the surface oxide film may be very low.

Referring to FIGS. 14A through 14D, the surface oxide film that is formed on the exposed surface of the channel isolation region 180 and the nanowire 120 is removed from a resultant structure of FIGS. 13A through 13D, and then the gate dielectric film 132 is formed on an exposed surface in the gate space GS, that is, on an exposed surface of each of the nanowire 120 and the channel isolation region 180, exposed surfaces of the inner insulating spacers 170, and exposed surfaces of the outer insulating spacers 150, and the gate 130 that fills the gate space GS is formed on the gate dielectric film 132.

For example, in order to form the semiconductor device 100B of FIG. 2, a plurality of contact holes through which the source/drain regions 142 are exposed are formed by etching a part of the insulating film 160, and then the metal silicide film 164 may be formed on top surfaces of the source/drain regions 142 which are exposed through the contact holes and the contacts 162 that are respectively connected to the source/drain regions 142 through the metal silicide film 164 may be formed on the metal silicide film 164.

Although a process of manufacturing the semiconductor device 100B of FIG. 2 has been explained with reference to FIGS. 2A through 14D, the present embodiment is not limited thereto and various modifications and changes may be made. For example, when a process of forming the channel isolation region 180 is omitted in a process described with reference to FIGS. 3A and 3B, the semiconductor device 100A of FIGS. 1A through 1D may be obtained.

FIGS. 15A through 15D are cross-sectional views according to a process order for explaining a method of manufacturing a semiconductor device, according to another embodiment. In FIGS. 15A through 15D, the same elements as those in FIGS. 1A through 14D are denoted by the same reference numerals, and a detailed explanation thereof will not be given in order to avoid a repeated explanation.

Figure 15A:
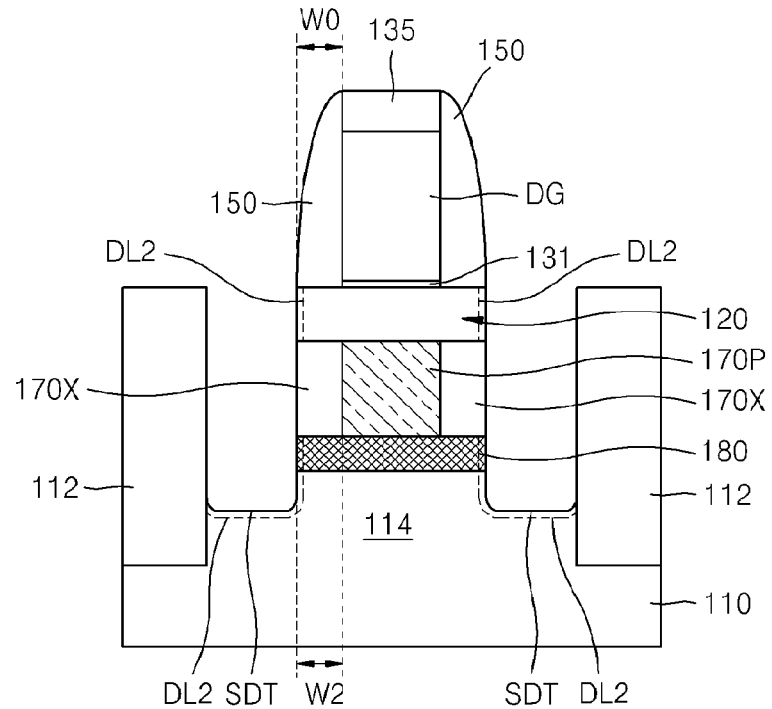
FIGS. 15A through 15D are cross-sectional views according to a process order for explaining a method of manufacturing a semiconductor device, according to another embodiment.

Referring to FIG. 15A, up to a process of forming the source/drain trenches SDT that are disposed at both sides of the dummy gate structure DG is performed according to the same processes as those described with reference to FIGS. 3A through 8B.

For example, a pair of inner insulating spacers 170X are formed on portions of the sacrificial layer 170P which are exposed in the source/drain trenches SDT by oxidizing a part of the sacrificial layer 170P on a resultant structure including the source/drain trenches SDT, in a manner similar to that described with reference to FIGS. 13A through 13D.

In detail, in order to form the inner insulating spacers 170X, a resultant structure of FIGS. 8A and 8B including the sacrificial layer 170P that is exposed in the source/drain trenches SDT is exposed to an oxidizing atmosphere. An $O_2$ gas may be used as an oxidizing gas. The oxidizing atmosphere may be maintained at a temperature ranging from about 400° C. to about 700° C. For example, when the sacrificial layer 170P is formed of SiGe and the nanowire 120 is formed of Si, the substrate 110 may be placed in an oxidation chamber that is maintained at a temperature of about 600° C., and may be maintained for about 30 minutes while supplying an $O_2$ gas to the substrate 110. In this case, an oxidation rate of the sacrificial layer 170P formed of SiGe may be much higher than an oxidation rate of each of the nanowire 120 and the substrate 110. Accordingly, while a desired portion of the sacrificial layer 170P is oxidized into a SiGe oxide, a very thin surface oxide film may be formed around a portion marked by a dashed line DL2 of FIG. 15A on exposed surfaces of the nanowire 120, the substrate 110, and the channel isolation region 180.

In an embodiment, a width W2 of each of the inner insulating spacers 170X may be equal to or less than a width W0 of each of the outer insulating spacers 150. However, the present embodiment is not limited thereto. Without departing from the scope of the inventive concept, the width W2 of each of the inner insulating spacers 170X may be greater than the width W0 of each of the outer insulating spacers 150.

Figure 15B:
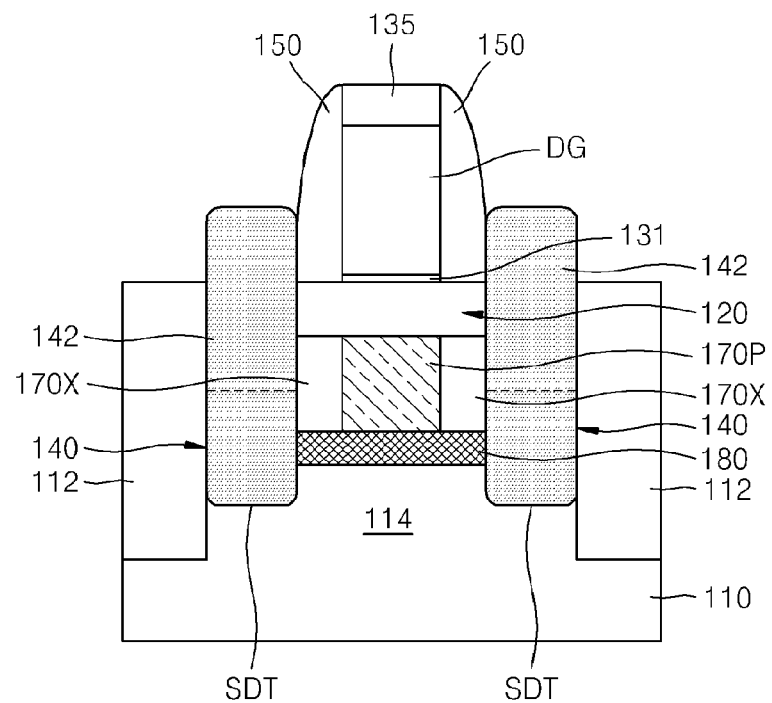

Referring to FIG. 15B, the surface oxide film formed on the exposed surfaces of the nanowire 120, the substrate 110, and the channel isolation region 180 is removed from a resultant structure of FIG. 15A, and then the semiconductor layers 140 and the source/drain regions 142 are formed in the source/drain trenches SDT by using the same method as that described with reference to FIGS. 9A and 9B.

Figure 15C:
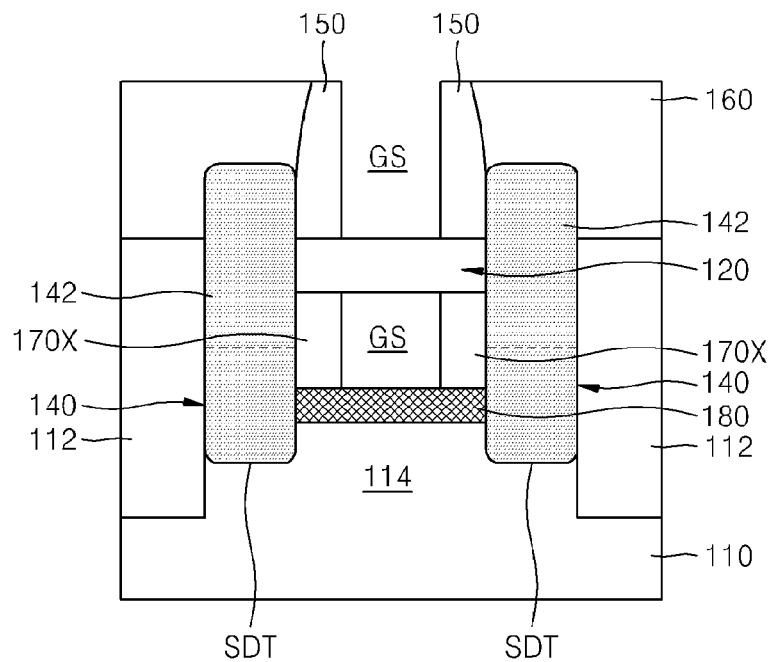

Referring to FIG. 15C, remaining portions of the dummy gate structure DG, the etch-stop film 131, and the sacrificial layer 170P are removed, for example, by performing the same processes as those described with reference to FIGS. 10A through 12D, and the gate space GS that exposes the channel region 122 around the nanowire 120 is formed.

The inner insulating spacers 170X that contact the source/drain regions 142 remain on a space of the gate space GS between the substrate 110 and the nanowire 120.

Figure 15D:
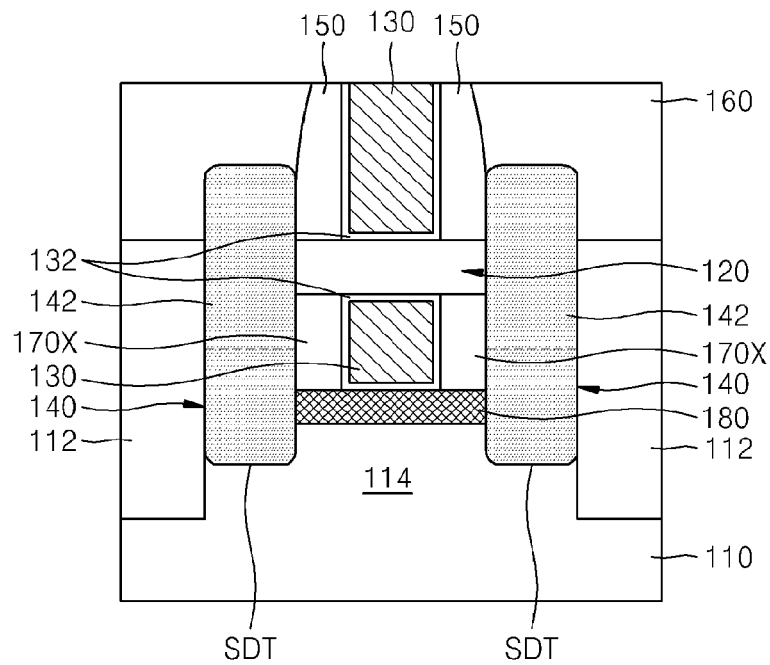

Referring to FIG. 15D, the gate dielectric film 132 is formed on an exposed surface of the gate space GS, that is, exposed surfaces of the nanowire 120 and the channel isolation region 180, exposed surfaces of the inner insulating spacers 170X, and exposed surfaces of the outer insulating spacers 150 by using, for example, the same method as that described with reference to FIGS. 14A through 14D, and the gate 130 that fills the gate space GS is formed on the gate dielectric film 132.

For example, in order to form the semiconductor device 100B of FIG. 2, a plurality of contact holes through which the source/drain regions 142 are exposed are formed by etching a part of the insulating film 160, and then the metal silicide film 164 may be formed on top surfaces of the source/drain regions 142 that are exposed through the contact holes and the contacts 162 that are respectively connected to the source/drain regions 142 may be formed on the metal silicide film 164 through the metal silicide film 164.

Figure 16A:
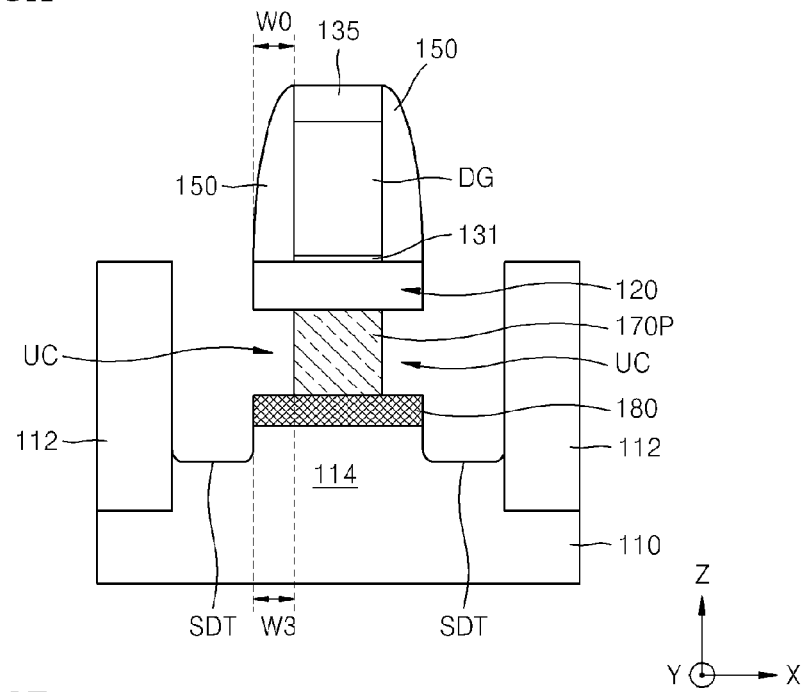
FIGS. 16A through 16C are cross-sectional views according to a process order for explaining a method of manufacturing a semiconductor device, according to another embodiment.
Figure 16B:
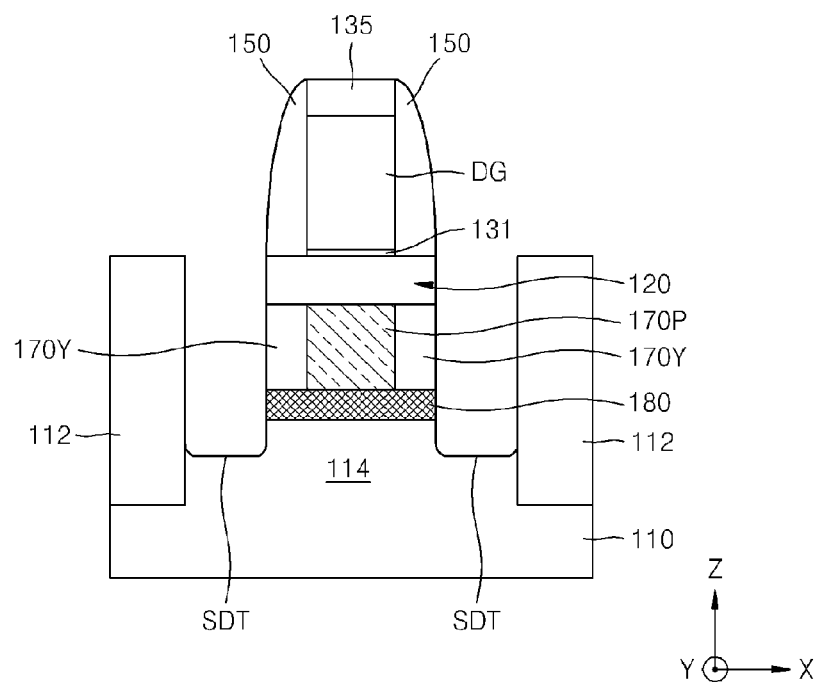
Figure 16C:
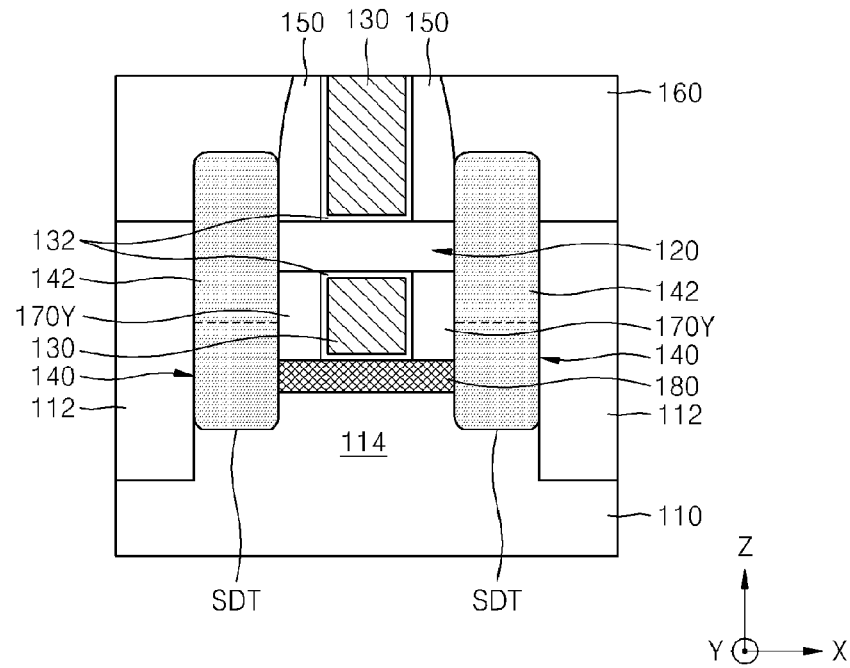

FIGS. 16A through 16C are cross-sectional views according to a process order for explaining a method of manufacturing a semiconductor device, according to another embodiment. In FIGS. 16A through 16C, the same elements as those in FIGS. 1A through 15D are denoted by the same reference numerals, and a detailed explanation thereof will not be given in order to avoid a repeated explanation.

Referring to FIG. 16A, up to a process of forming the source/drain trenches SDT that are disposed at both sides of the dummy gate structure DG is performed according to the same processes as those described with reference to FIGS. 3A through 8B.

For example, an undercut space UC is formed under both end portions of the nanowire 120 which face the substrate 110 by removing a part of the sacrificial layer 170P which is exposed in the source/drain trenches SDT.

In a direction (for example, X direction in FIG. 16A) parallel to the main surface extension direction of the substrate 110, a width W3 of the undercut space UC may be equal to or less than the width W0 of each of the outer insulating spacers 150. However, the present embodiment is not limited thereto. For example, the width W3 of the undercut space UC may be greater than the width W0 of each of the outer insulating spacers 150.

In order to form the undercut space UC, an etchant that selectively etches only the sacrificial layer 170P may be used. For example, when the sacrificial layer 170P is formed of SiGe and the nanowire 120 is formed of Si, an etchant that has a sufficiently high selective etch rate of SiGe with respect to Si may be used in order to suppress the nanowire 120 and the substrate 110 from being etched and selectively remove an exposed portion of the sacrificial layer 170P.

Referring to FIG. 16B, inner insulating spacers 170Y that fill the undercut space UC are formed by using deposition.

In an embodiment, an insulating material may be deposited in the source/drain trenches SDT to fill the undercut space UC in order to form the inner insulating spacers 170Y, and then the insulating material may be etched-back in a space of the source/drain trenches SDT excluding the undercut space UC by using anisotropic dry etching. In order not to remove the device isolation film 112 during the etch-back, a protective material layer that has an etch selectivity with respect to the insulating material may cover the device isolation film 112 before the insulating material is deposited in the source/drain trenches SDT. The insulating material may be etched in the source/drain trenches SDT in a state where the protective material layer covers a top surface of the device isolation film 112 during the etch-back. In an embodiment, when the device isolation film 112 includes an oxide film and the inner insulating spacers 170Y are formed of an oxide film, a nitride film may be used as the protective material layer that covers the top surface of the device isolation film 112.

In an embodiment, the inner insulating spacers 170Y may be formed of a material that has a dielectric constant lower than a dielectric constant of the gate dielectric film 132 (see FIG. 16C) that is formed during a subsequent process. For example, the inner insulating spacers 170Y may have a dielectric constant equal to or lower than about 2. In an embodiment, the inner insulating spacers 170Y may be formed of a silicon oxide. Alternatively, the inner insulating spacers 170Y may be formed of a silicon oxide in which an air layer is included. The air layer may be obtained when a void is formed in the undercut space UC while the insulating material is deposited in the source/drain trenches SDT and the void remains in the form of an air layer.

Referring to FIG. 16C, the source/drain regions 142 are formed by performing the same processes as those described with referenced to FIGS. 15B through 15D, the gate dielectric film 132 is formed on exposed surfaces of the nanowire 120 and the channel isolation region 180, surfaces of the inner insulating spacers 170Y, and surfaces of the outer insulating spacers 150, and the gate 130 that fills the gate space GS is formed on the gate dielectric film 132.

For example, in order to form the semiconductor device 100B of FIG. 2, a plurality of contact holes through which the source/drain regions 142 are exposed may be formed by etching a part of the insulating film 160, and then the metal silicide film 164 may be formed on top surfaces of the source/drain regions 142 that are exposed through the contact holes and the contacts 162 that are respectively connected to the source/drain regions 142 may be formed on the metal silicide film 164 through the metal silicide film 164.

Figure 17:
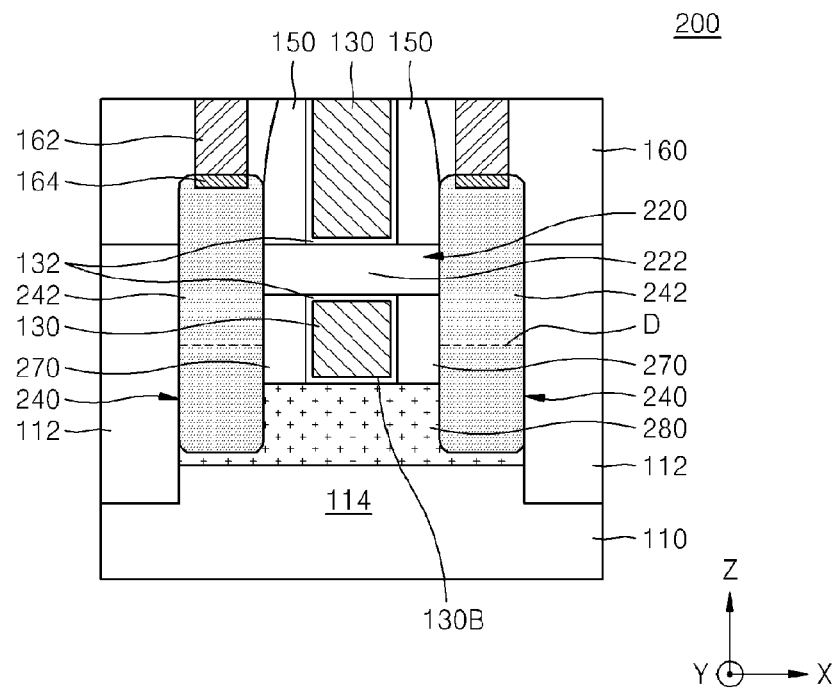
FIG. 17 is a cross-sectional view illustrating a semiconductor device according to another embodiment.

FIG. 17 is a cross-sectional view illustrating a semiconductor device 200 according to another embodiment. In FIG. 17, the same elements as those in FIGS. 1A through 1D are denoted by the same reference numerals, and a detailed explanation thereof will not be given in order to avoid a repeated explanation.

Referring to FIG. 17, the semiconductor device 200 includes a buffer layer 230 that is disposed between the substrate 110 and the gate 130 and extends in the main surface extension direction (X direction) of the substrate 110.

The buffer layer 280 may be formed of a material that has a lattice constant higher than a lattice constant of the substrate 110. In an embodiment, the substrate 110 may be formed of Si, and the buffer layer 280 may be formed of, for example, GaAs, InP, InAlAs, or a combination thereof. The buffer layer 280 may have a single-layer structure or a multi-layer structure. In an embodiment, the buffer layer 280 may have a multi-layer structure in which a first layer formed of GaAs and a second layer formed of InP or InAlAs are sequentially stacked from the substrate 110.

A channel region 222 of a nanowire 220 may be formed of a group III-V compound semiconductor. In an embodiment, the channel region 222 of the nanowire 220 may be formed of, for example, an InGaAs film or a Ge film. When the channel region 222 of the nanowire 220 is formed of an InGaAs film, the channel region 222 of the nanowire 220 may be formed of, for example, $In_{0.53}Ga_{0.47}As$. The description of the channel region 122 of the nanowire 120 of FIGS. 1A through 1D applies to the channel region 222 of the nanowire 220.

A pair of semiconductor layers 240 are connected to both sides of the nanowire 220. Source/drain regions 242 are respectively included in the semiconductor layers 240. The source/drain regions 242 may be formed by implanting N-type impurity ions or P-type impurity ions into the semiconductor layers 240.

The semiconductor layers 240 may be formed of a group III-V compound semiconductor. In an embodiment, for example, the semiconductor layers 240 may be formed of $In_{0.53}Ga_{0.47}As$, $In_{0.7}Ga_{0.3}As$, InAs, SiGe, or a combination thereof. In an embodiment, for example, the semiconductor layers 240 may have a single-layer structure formed of $In_{0.53}Ga_{0.47}As$. Alternatively, the semiconductor layers 240 may have a single-layer structure formed of $In_{0.7}Ga_{0.3}As$. Alternatively, the semiconductor layers 240 may have a single-layer structure formed of SiGe. Alternatively, the semiconductor layers 240 may have a double-layer structure in which a first layer formed of $In_{0.53}Ga_{0.47}As$ and a second layer formed of $In_{0.7}Ga_{0.3}As$ are sequentially stacked. Alternatively, the semiconductor layers 240 may have a double-layer structure in which a first layer formed of $In_{0.53}Ga_{0.47}As$ and a second layer formed of InAs are sequentially stacked. In the semiconductor layers 240 having the double-layer structure, a distance from the substrate 110 to the second layer in a vertical direction (Z direction) may be greater than a distance from the substrate 110 to a top surface of the nanowire 220 in the vertical direction. For example, the second layer of the semiconductor layers 240 may be formed on the substrate 110 to have a level higher than that of the nanowire 220. In an embodiment, impurity ions included in the source/drain regions 242 may be selected from, but are not limited to, group IV elements including Si, Ge, and carbon (C). The description of the semiconductor layers 140 and the source/drain regions 142 of FIGS. 1A through 1D applies to the semiconductor layers 240 and the source/drain regions 242.

Inner insulating spacers 270 are formed between the buffer layer 280 and the nanowire 220. The inner insulating spacers 270 are disposed between the gate dielectric film 132 and the source/drain regions 240. The inner insulating spacers 270 may be formed of a material that is different from that of the gate dielectric film 132.

In an embodiment, the inner insulating spacers 270 may be formed of a material that has a dielectric constant lower than a dielectric constant of a material of the gate dielectric film 132. In an embodiment, for example, the inner insulating spacers 270 may be formed of an oxide of a group III-V compound semiconductor. For example, the inner insulating spacers 270 may be formed of, but are not limited to, an InP oxide. Alternatively, the inner insulating spacers 270 may be formed of a silicon oxide. The description of the inner insulating spacers 170 of FIGS. 1A through 1D applies to the inner insulating spacers 270.

In order to increase a carrier mobility of the semiconductor device 200 that constitutes a MOS transistor, the channel region 222 of the nanowire 220 may be formed to include a strained channel.

In detail, when the semiconductor device 200 constitutes a PMOS transistor, in order to provide the nanowire 220 including the strained channel, the nanowire 220 may be formed of Ge and the source/drain regions 242 that are connected to both ends of the nanowire 220 may be formed of doped SiGe. Alternatively, when the semiconductor device 200 constitutes an NMOS transistor, in order to provide the nanowire 220 including the strained channel, the nanowire 220 may be formed of InGaAs and the source/drain regions 242 may be formed of doped InGaAs. In this case, a composition ratio of In and Ga in an InGaAs film constituting the nanowire 220 may be the same as or different from a composition ratio of In and Ga in an InGaAs film constituting the source/drain regions 242.

In the semiconductor device 200 of FIG. 17, the source/drain regions 242 are formed in the semiconductor layers 240 that are re-grown from the substrate 110 and the nanowire 220. The gate 130 is formed to be spaced apart from the source/drain regions 242 in the main surface extension direction (X direction) of the substrate 110. Accordingly, a gate parasitic resistance and a leakage current between the gate 130 and the source/drain regions 242 may be effectively suppressed. Also, since a material of the semiconductor layers 240 in which the source/drain regions 242 are formed has a lattice constant that is different from a lattice constant of a material of the nanowire 220, the source/drain regions 242 may act as a stressor for applying a compressive or tensile stress to the channel region 222. Also, not only the gate dielectric film 132 but also the inner insulating spacers 270 are disposed between the gate 130 and the source/drain regions 242. The inner insulating spacers 270 may more effectively suppress gate parasitic capacitance between the gate 130 and the source/drain regions 242. Accordingly, the semiconductor device 200 including the inner insulating spacers 270 disposed between the gate dielectric film 132 and the source/drain regions 242 may improve an operation speed of the semiconductor device 200.

Figure 18A:
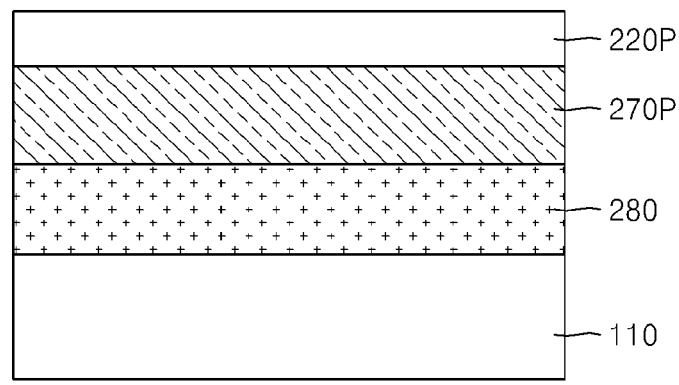
FIGS. 18A and 18B are cross-sectional views according to a process order for explaining a method of manufacturing the semiconductor device of FIG. 17.
Figure 18B:
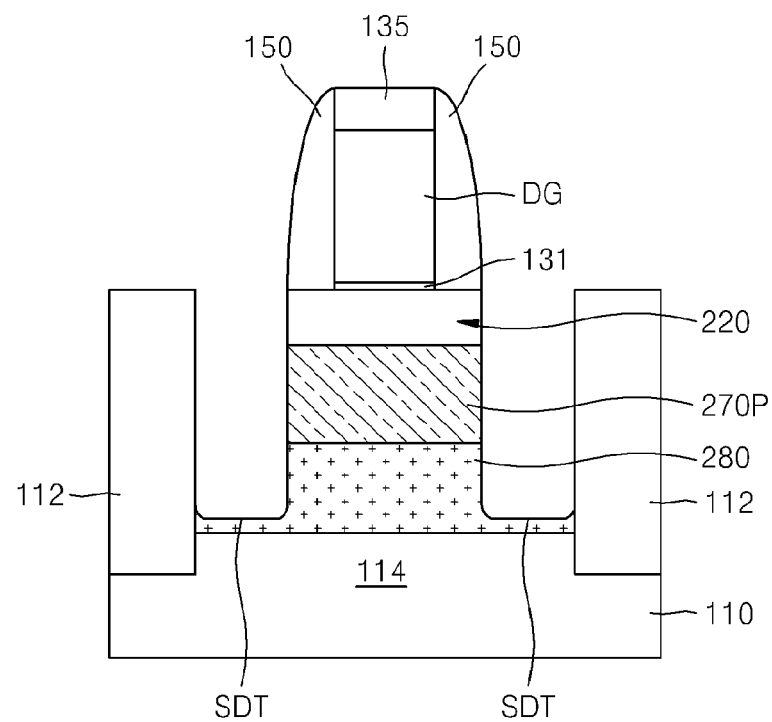

FIGS. 18A and 18B are cross-sectional views according to a process order for explaining a method of manufacturing the semiconductor device 200 of FIG. 17. In FIGS. 18A and 18B, the same elements as those in FIGS. 1A through 14D are denoted by the same reference numerals, and a detailed explanation thereof will not be given in order to avoid a repeated explanation.

Referring to FIG. 18A, a buffer layer 280, a sacrificial layer 270P, and a channel semiconductor layer 220P are sequentially formed on the substrate 110.

The buffer layer 280 may be disposed between the substrate 110 and the sacrificial layer 270P, and may be formed of, for example, GaAs, InP, InAlAs, or a combination thereof in order to match a crystal structure of the substrate 110 to a crystal structure of the sacrificial layer 270P. In an embodiment, for example, the buffer layer 280 may have a GaAs/InP stacked structure or a GaAs/InAlAs stacked structure.

In an embodiment, for example, the sacrificial layer 270P may be formed of InP.

In an embodiment, for example, the channel semiconductor layer 220P may be formed of a group III-V compound semiconductor. For example, the channel semiconductor layer 220P may be formed of $In_{0.53}Ga_{0.47}As$.

Referring to FIG. 18B, one pair of source/drain trenches SDT through which both end portions of the nanowire 220 are exposed are formed on a resultant structure of FIG. 18A by performing processes similar to those described with reference to FIGS. 3A through 8B.

Although the source/drain trenches SDT may be formed to have bottom surfaces having levels higher than that of a top surface of the substrate 110 as shown in FIG. 18B, the present embodiment is not limited thereto. Since the source/drain trenches SDT are formed, the nanowire 220 may be formed by a portion of the channel semiconductor layer 220P which remains after a part of the channel semiconductor layer 220P is removed.

The buffer layer 280, the sacrificial layer 270P, and the nanowire 220 may be exposed in the source/drain trenches SDT.

For example, the semiconductor device 200 of FIG. 17 is formed by performing the same processes as those described with reference to FIGS. 9A through 14D.

In an embodiment, the inner insulating spacers 270 of the semiconductor device 200 of FIG. 17 may be obtained by oxidizing a part of the sacrificial layer 270P by using a method similar to a method of oxidizing the residual sacrificial layer (see FIGS. 12B and 12D) described with reference to FIGS. 13A through 13D. Alternatively, the inner insulating spacers 270 of the semiconductor device 200 of FIG. 17 may be obtained by oxidizing a part of the sacrificial layer 270P by using a method similar to a method of forming the inner insulating spacers 170X by oxidizing a part of the sacrificial layer 170P described with reference to FIG. 15A. Alternatively, the inner insulating spacers 270 of the semiconductor device 200 of FIG. 17 may be formed by using the same deposition as deposition for forming the inner insulating spacers 170Y described with reference to FIGS. 16A and 16B.

Figure 19:
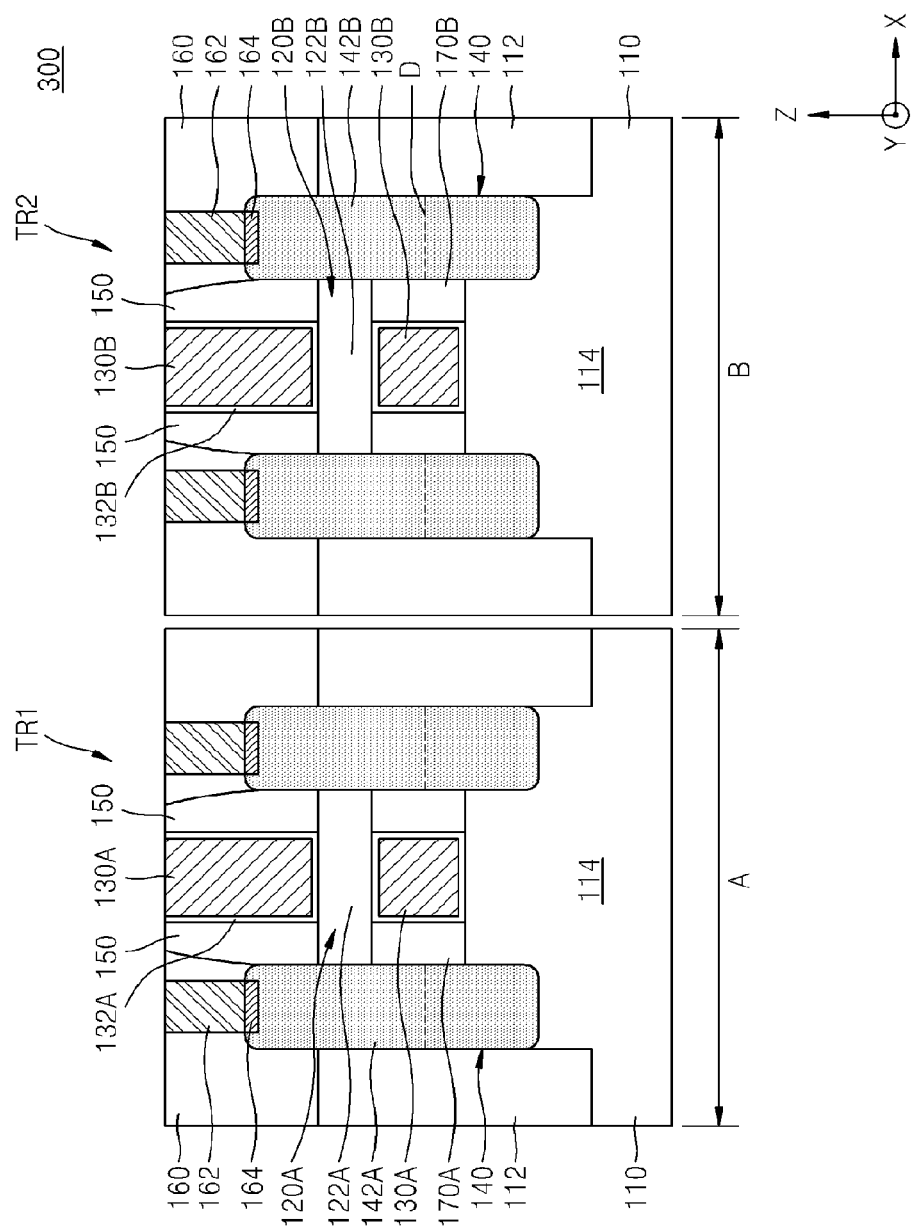
FIG. 19 is a cross-sectional view illustrating a semiconductor device according to another embodiment.

FIG. 19 is a cross-sectional view illustrating a semiconductor device 300 according to another embodiment. In FIG. 19, the same elements as those in FIGS. 1A through 1D are denoted by the same reference numerals, and a detailed explanation thereof will not be given in order to avoid a repeated explanation.

Referring to FIG. 19, the substrate 110 of the semiconductor device 300 includes a first device region A and a second device region B.

A plurality of transistors are formed in a plurality of active regions 114 that are defined by the device isolation film 112 in the first device region A and the second device region B of the substrate 110. In an embodiment, a PMOS transistor TR1 may be formed in the first device region A of the substrate 110, and an NMOS transistor TR2 may be formed in the second device region B.

The PMOS transistor TR1 includes a first nanowire 120A that has a first channel region 122A, a first gate 130A that surrounds the first nanowire 120A with a first gate dielectric film 132A therebetween, a pair of first source/drain regions 142A that are connected to both end portions of the first nanowire 120A, and a pair of first inner insulating spacers 170A that are disposed between the first gate dielectric film 132A and the first source/drain regions 142A. The pair of first inner insulating spacers 170A are also disposed between the pair of first source/drain regions 142A and between the first nanowire 120A and the substrate 110.

The NMOS transistor TR2 includes a second nanowire 120B that has a second channel region 122B, a second gate 130B that surrounds the second nanowire 120B with a second gate dielectric film 132B therebetween, a pair of second source/drain regions 142B that are connected to both end portions of the second nanowire 120B, and a pair of inner insulating spacers 170B that are disposed between the second gate dielectric film 132B and the second source/drain regions 142B. The pair of second inner insulating spacers 170B are also disposed between the pair of second source/drain regions 142B and between the second nanowire 120B and the substrate 110.

The description of the nanowire 120, the gate 130, and the gate dielectric film 132 of FIGS. 1A through 1D applies to the first nanowire 120A and the second nanowire 120B, the first gate 130A and the second gate 130B, and the first gate dielectric film 132A and the second gate dielectric film 132B.

The second source/drain regions 142B are formed of a material that is different from that of the first source/drain regions 142A. In an embodiment, the first source/drain regions 142A may be formed of SiGe or Ge, and the second source/drain regions 142B may be formed of SiC.

For example, each of the first inner insulating spacers 170A and the second inner insulating spacers 170B may be formed of an oxide of a group IV semiconductor, an oxide of a group IV-IV compound semiconductor, an oxide of a group III-V compound semiconductor, or a silicon oxide. The description of the inner insulating spacers 170 of FIGS. 1A through 1D applies to the first inner insulating spacers 170A and the second inner insulating spacers 170B.

Although the semiconductor device 300 including a CMOS transistor consisting of the PMOS transistor TR1 and the NMOS transistor TR2 having a structure similar to that of the semiconductor device 100A of FIGS. 1A through 1D has been described with reference to FIG. 19, the present embodiment is not limited thereto. For example, a semiconductor including a CMOS transistor consisting of a PMOS transistor and an NMOS transistor having a structure similar to that of the semiconductor device 100B of FIG. 2 or the semiconductor device 200 of FIG. 17 may be included within the scope of the embodiments disclosed herein.

Figure 20A:
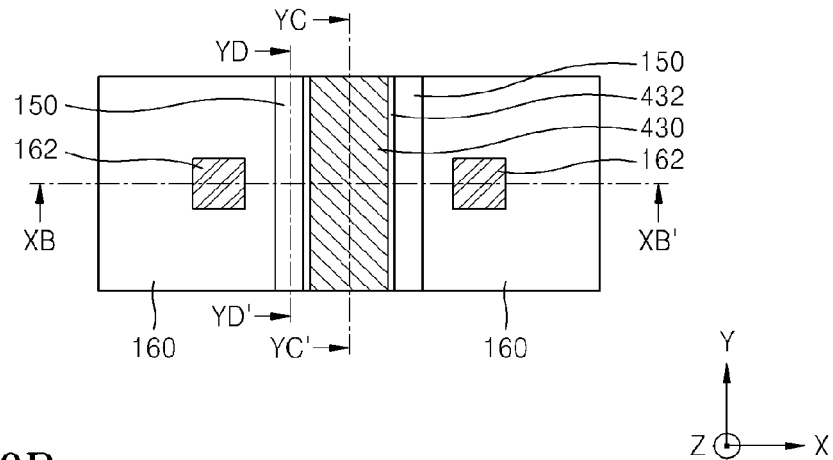
FIGS. 20A through 20D are views illustrating a semiconductor device according to another embodiment.
Figure 20B:
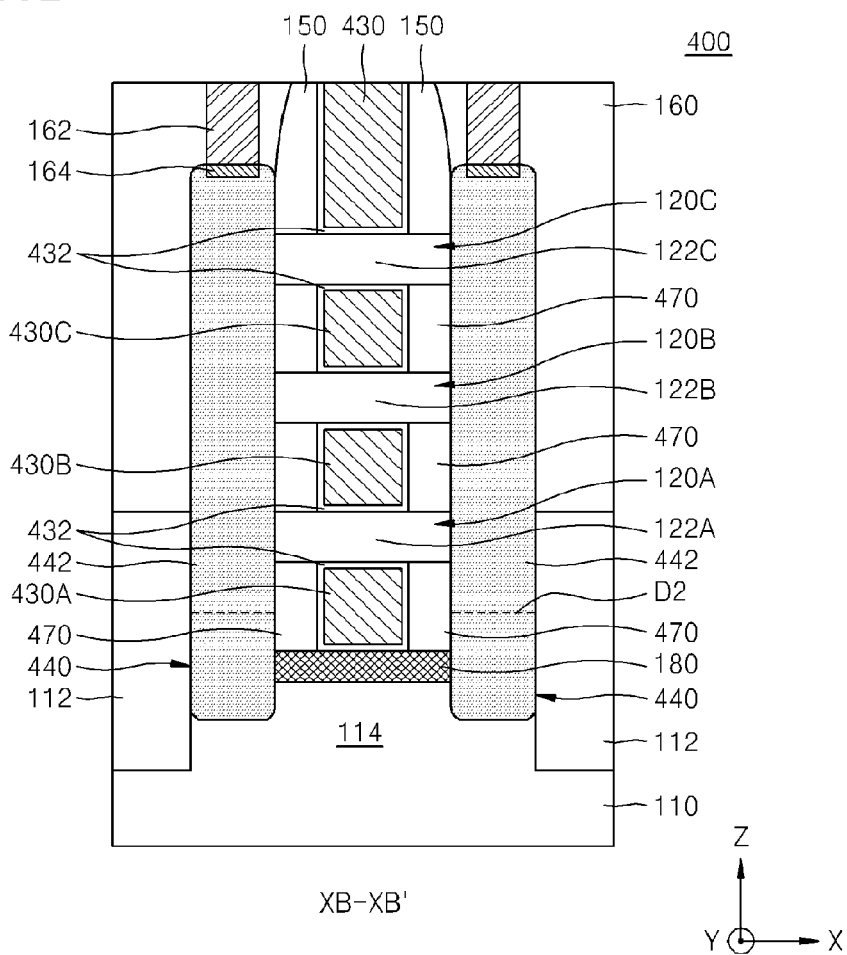
Figure 20C:
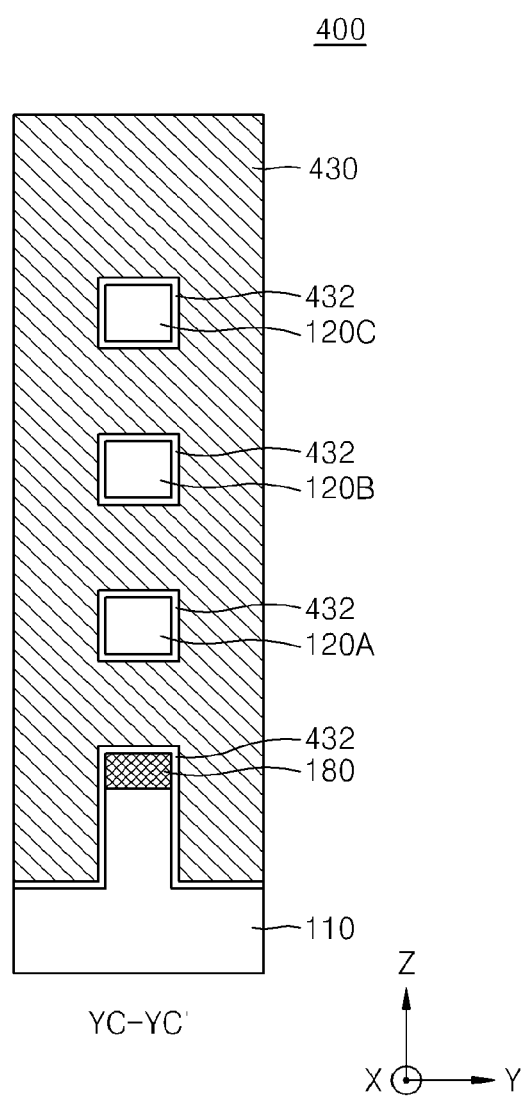
Figure 20D:
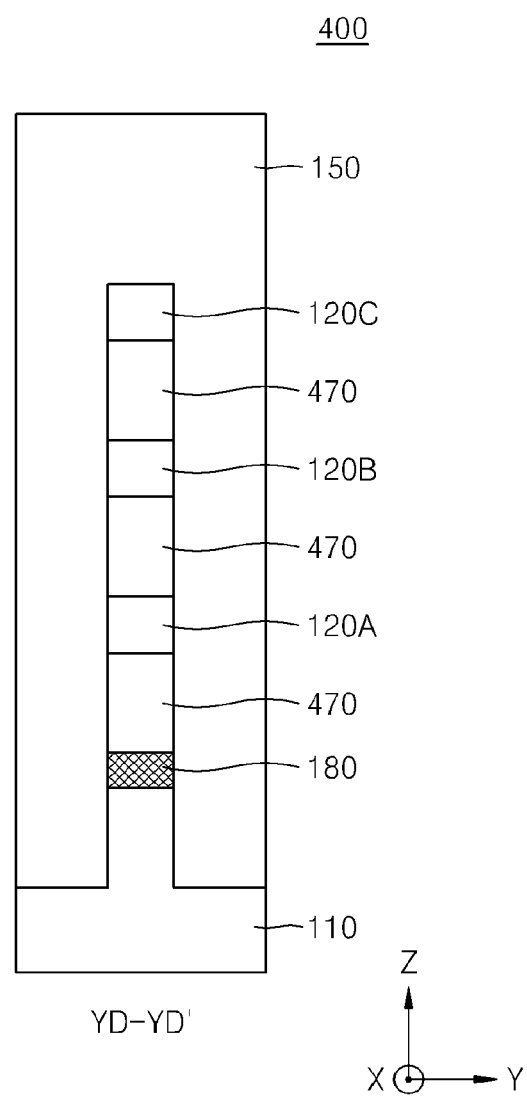

FIGS. 20A through 20D are views illustrating a semiconductor device 400 according to another embodiment. In detail, FIG. 20A is a plan view illustrating the semiconductor device 400. FIG. 20B is a cross-sectional view taken along line XB-XB' of FIG. 20A. FIG. 20C is a cross-sectional view taken along line YC-YC' of FIG. 20A. FIG. 20D is a cross-sectional view taken along line YD-YD' of FIG. 20A. In FIGS. 20A through 20D, the same elements as those in FIGS. 1A through 2 are denoted by the same reference numerals, and a detailed explanation thereof will not be given in order to avoid a repeated explanation.

Referring to FIGS. 20A through 20D, the semiconductor device 400 includes the substrate 110, and a plurality of nanowires 120A, 120B, and 120C that extend in a direction (X direction) parallel to the main surface extension direction of the substrate 110 to be spaced apart from the substrate 110 and have channel regions 122A, 122B, and 122C. Distances of the plurality of nanowires 120A, 120B, and 120C from the substrate 110 are different from one another.

A gate 430 is formed to surround at least a part of each of the plurality of nanowires 120A, 120B, and 120C. The gate 430 includes sub-gates 430A, 430B, and 430C that are formed in a space between the substrate 110 and the plurality of nanowires 120A, 120B, and 120C.

A gate dielectric film 432 is disposed between the channel regions 122A, 122B, and 122C and the gate 430.

A pair of semiconductor layers 440 extend from the substrate 110 in a direction (Z direction) perpendicular to the main surface extension direction of the substrate 110 to be connected to one ends of the plurality of nanowires 120A, 120B, and 120C. Source/drain regions 442 that contact one ends of the plurality of nanowires 120A, 120B, and 120C are formed on the semiconductor layers 440. The source/drain regions 442 may be formed by implanting N-type impurity ions or P-type impurity ions into the semiconductor layers 440 to a depth D2 marked by a dashed line. In an embodiment, the source/drain regions 442 that are formed in the semiconductor layers 440 may be formed to have bottom surfaces that have levels that are about the middle of the sub-gate 430A that is formed in a space between the substrate 110 and the nanowire 120A that is the closest to the substrate 110. For example, when ions are implanted in order to form the source/drain regions 442, an ion implantation depth may be controlled such that the depth D2 to which the impurity ions are implanted becomes a level between the substrate 110 and the nanowire 120A that is the closest to the substrate 110.

The semiconductor device 400 includes a plurality of inner insulating spacers 470 that are formed between the source/drain regions 442 and the plurality of sub-gates 430A, 430B, and 430C constituting the gate 430 between the substrate 110 and the plurality of nanowires 120A, 120B, and 120C. The plurality of inner insulating spacers 470 are formed of a material that is different from that of the gate dielectric film 432.

The description of the nanowire 120, the gate 130, the gate dielectric film 132, the semiconductor layers 140, and the source/drain regions 142 of FIGS. 1A through 1D applies to the plurality of nanowires 120A, 120B, and 120C, the gate 430, the gate dielectric film 432, the semiconductor layers 440, and the source/drain regions 442.

In the semiconductor device 400 of FIGS. 20A through 20D, the source/drain regions 442 are formed in the semiconductor layers 440 that are re-grown from the substrate 110 and the nanowires 120A, 120B, and 120C. The gate 430 is formed to be spaced apart from the source/drain regions 442 in the main surface extension direction (X direction) of the substrate 110. Accordingly, a gate parasitic capacitance and a leakage current between the gate 430 and the source/drain regions 442 may be effectively suppressed. Also, since a material of the semiconductor layers 440 in which the source/drain regions 442 are formed has a lattice constant that is different from a lattice constant of a material of the nanowires 120A, 120B, and 120C, the source/drain regions 442 may act as a stressor for applying a compressive or tensile stress to the channel regions 122A, 122B, and 122C. For example, not only the gate dielectric film 432 but also the inner insulating spacers 470 are disposed between the gate 430 and the source/drain regions 442. The inner insulating spacers 470 may more effectively suppress the gate parasitic capacitance and the leakage current between the gate 430 and the source/drain regions 442. Accordingly, the semiconductor device 400 including the inner insulating spacers 470 disposed between the gate dielectric film 432 and the source/drain regions 442 may improve an operation speed of the semiconductor device 400.

FIGS. 21A through 28D are views illustrating according to a process order for explaining a method of manufacturing a semiconductor device, according to another embodiment. In the present embodiment, a method of manufacturing the semiconductor device 400 of FIGS. 20A through 20D is exemplarily explained. In FIGS. 21A through 28D, FIGS. 21A, 22A, . . . , and 28A are plan views for explaining each process order. FIGS. 21B, 22B, . . . , and FIG. 28B are cross-sectional views taken along line XB-XB' of FIGS.

Figure 28A:
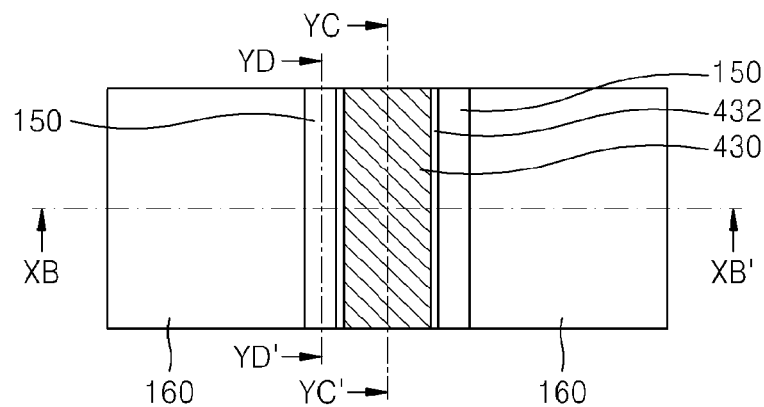
Figure 28B:
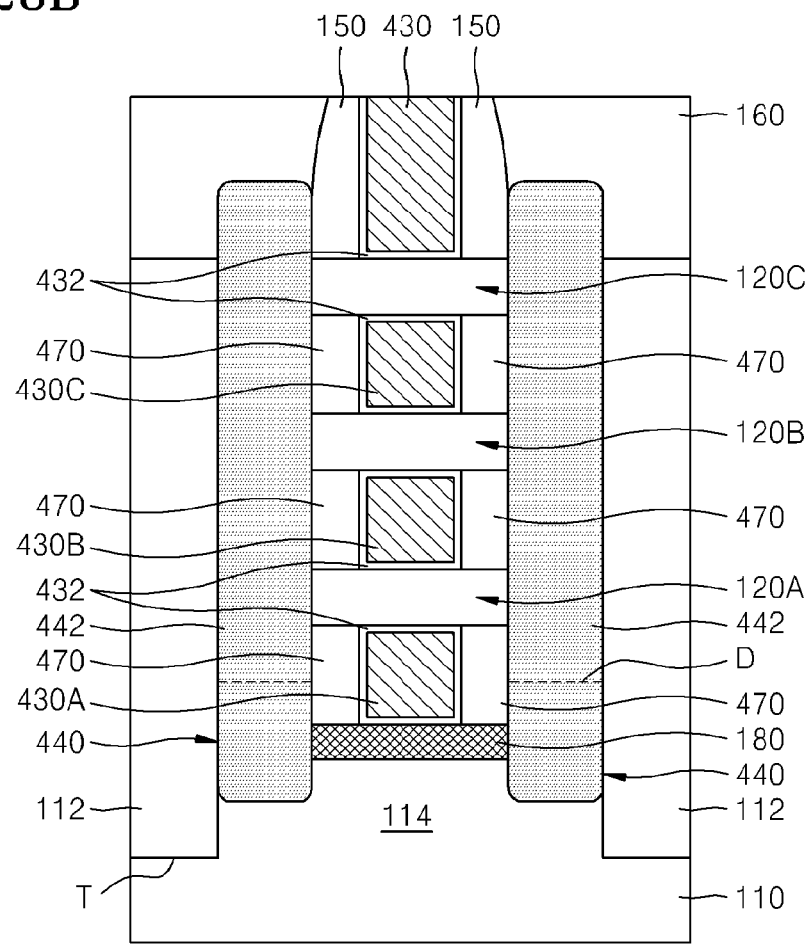
Figure 28C:
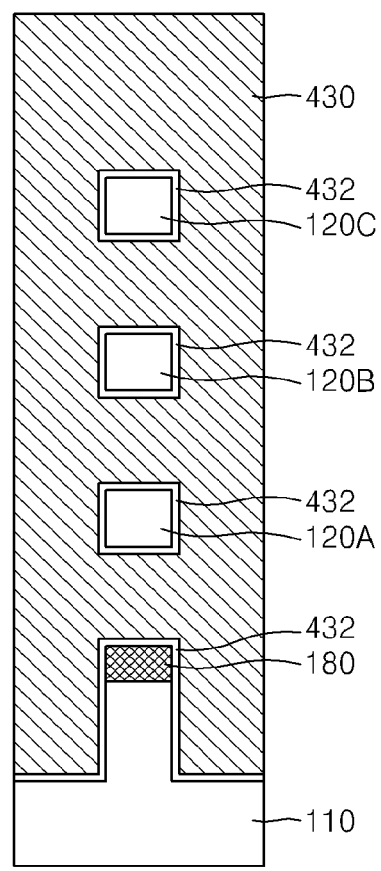
Figure 28D:
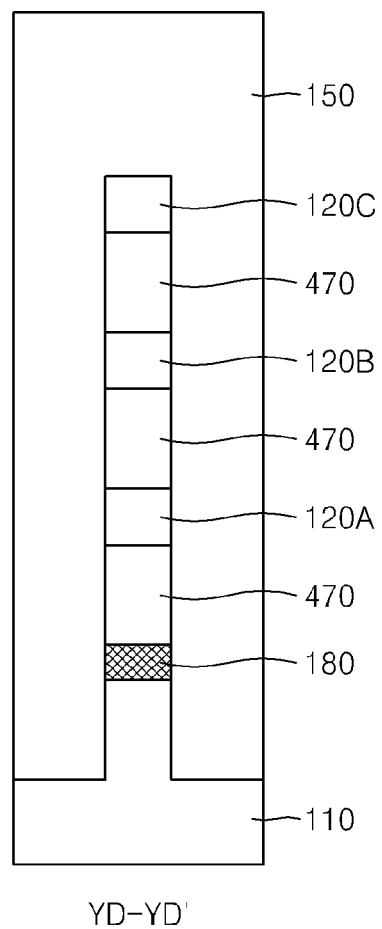

21A, 22A, . . . , and FIG. 28A, respectively. FIGS. 25C, 26C, 27C, and 28C are cross-sectional views taken along line YC-YC' of FIGS. 25A, 26A, 27A, and 28A. FIGS. 25D, 26D, 27D, and 28D are cross-sectional views taken along line YD-YD' of FIGS. 25A, 26A, 27A, and 28A, respectively. In FIGS. 21A through 28D, the same elements as those in FIGS. 1A through 20D are denoted by the same reference numerals, and a detailed explanation thereof will not be given in order to avoid a repeated explanation.

Figure 21A:
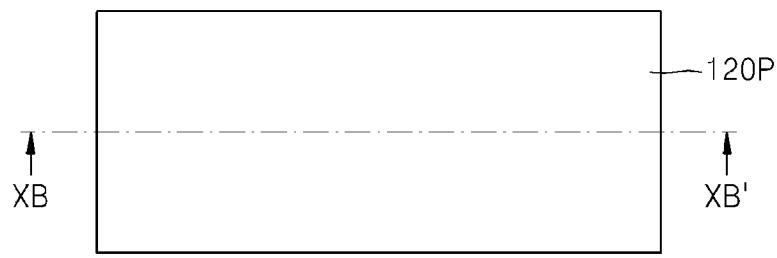
FIGS. 21A through 28D are views according to a process order for explaining a method of manufacturing a semiconductor device, according to another embodiment, FIGS. 21A, 22A, . . . , and 28A being plan views for explaining each process order, FIGS. 21B, 22B, . . . , and 28B being cross-sectional views taken along line XB-XB' of FIGS. 21A, 22A, . . . , and 28A, respectively, FIGS. 25C, 26C, and 27C, and 28C being cross-sectional views taken along line YC-YC' of FIGS. 25A, 26A, 27A, and 28A, respectively, and FIGS. 25D, 26D, 27D, and 28D being cross-sectional views taken along line YD-YD' of FIGS. 25A, 26A, 27A, and 28A, respectively.
Figure 21B:
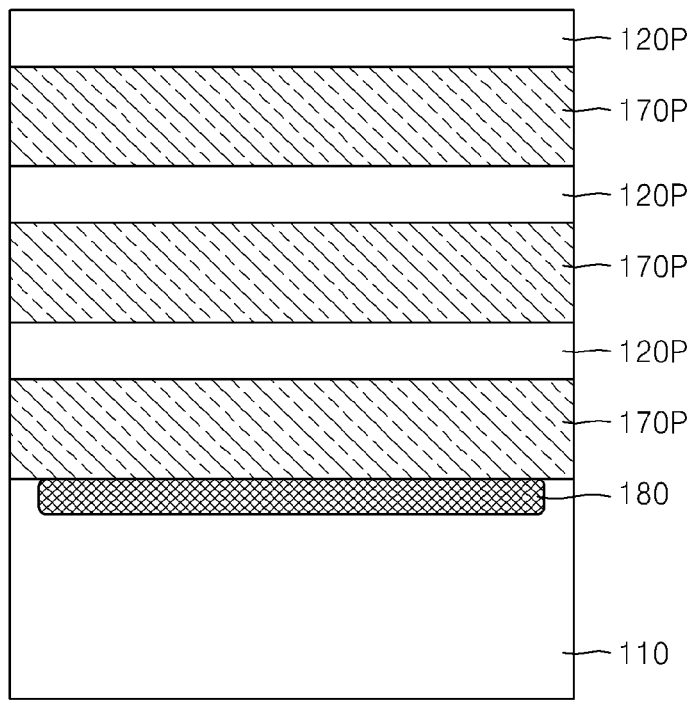

Referring to FIGS. 21A and 21B, the channel isolation region 180 is formed on the substrate 110 by using a method similar to that described with reference to FIGS. 3A and 3B, and then the sacrificial layer 170P and the channel semiconductor layer 120P are alternately formed several times on the substrate 110.

Although three sacrificial layers 170P and three channel semiconductor layers 120P are alternately formed in FIGS. 21A and 21B, the present embodiment is not limited thereto. For example, two sacrificial layers 170P and two channel semiconductor layers 120P may be alternately formed on the substrate 110, or if necessary, four or more sacrificial layers 170P and four or more channel semiconductor layers 120P may be alternately formed on the substrate 110.

In an embodiment, a process of forming the channel isolation region 180 may be omitted.

Figure 22A:
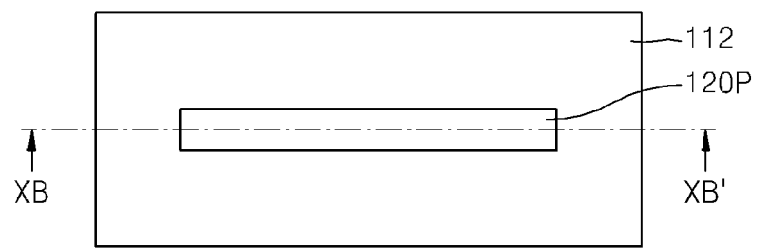
Figure 22B:
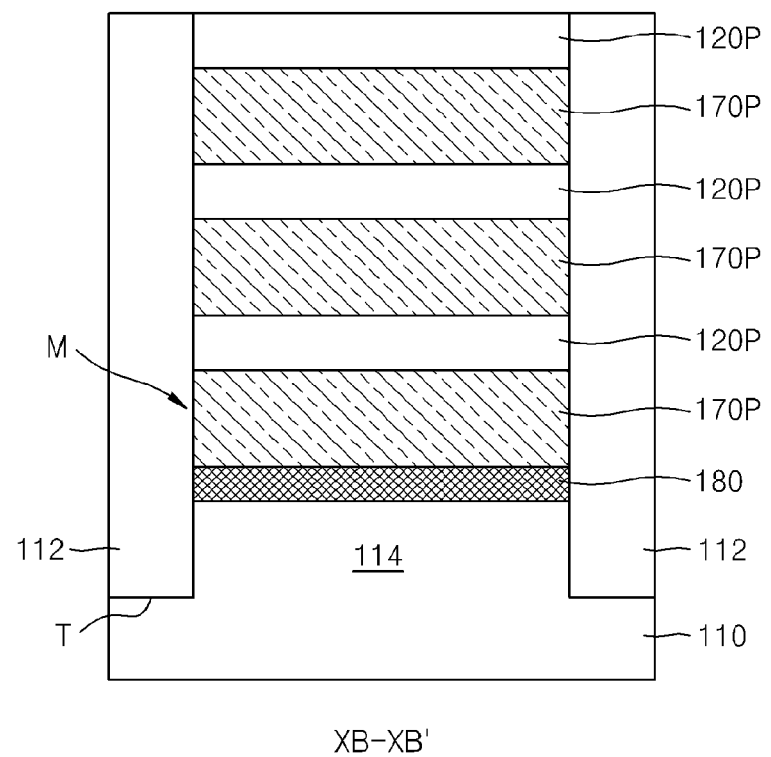

Referring to FIGS. 22A and 22B, the device isolation film 112 having a planarized top surface is formed by forming the trench T that defines the mesa structure M and filling an insulating material in the trench T by using the same method as that described with reference to FIGS. 4A through 5B.

Figure 23A:
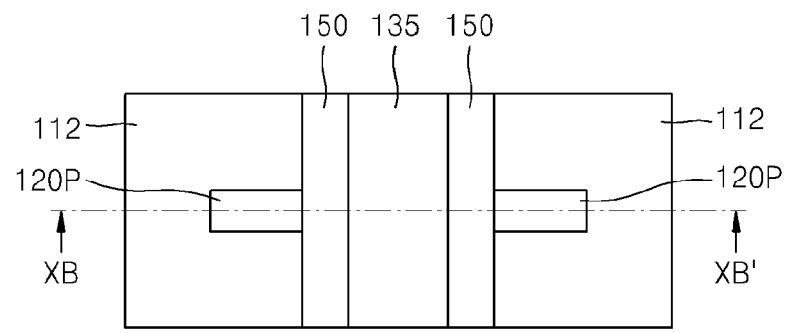
Figure 23B:
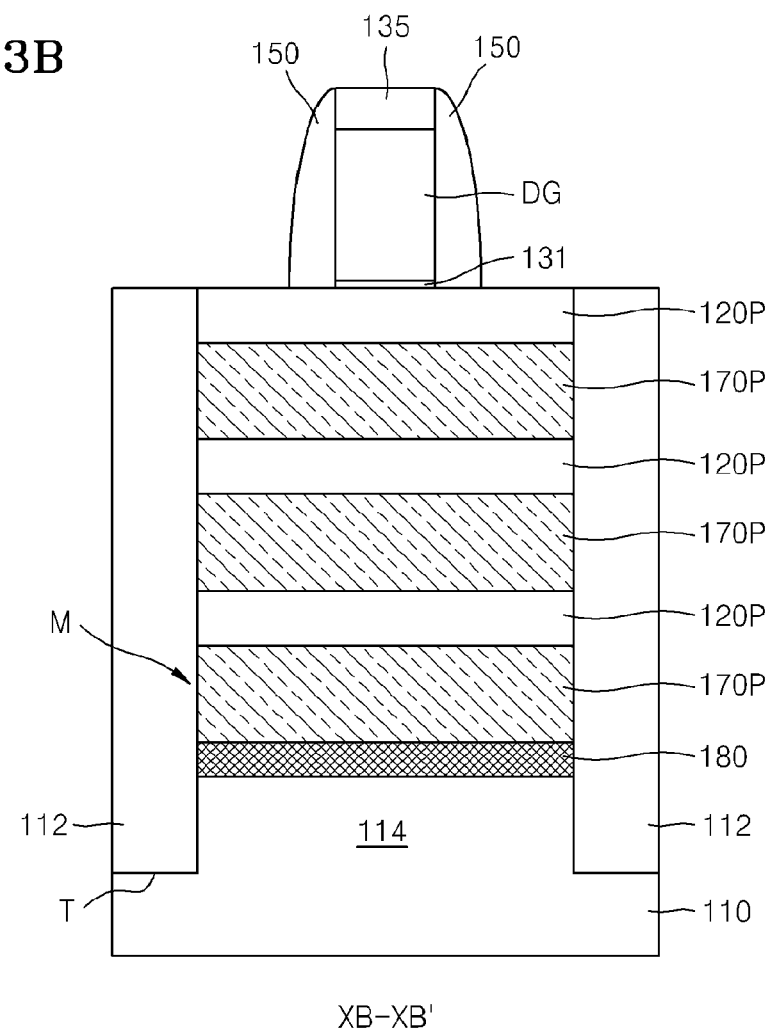

Referring to FIGS. 23A and 23B, the dummy gate structure DG that is covered by the capping pattern 135 is formed on the mesa structure M by using the same method as that described with reference to FIGS. 6A through 7B, and then the outer insulating spacers 150 that cover both side walls of the dummy gate structure DG and the capping pattern 135 are formed. The etch-stop film 131 may be disposed between the channel semiconductor layer 120P and the dummy gate structure DG.

Figure 24A:
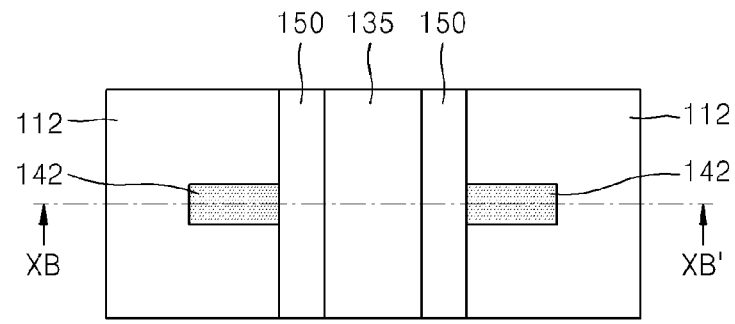
Figure 24B:
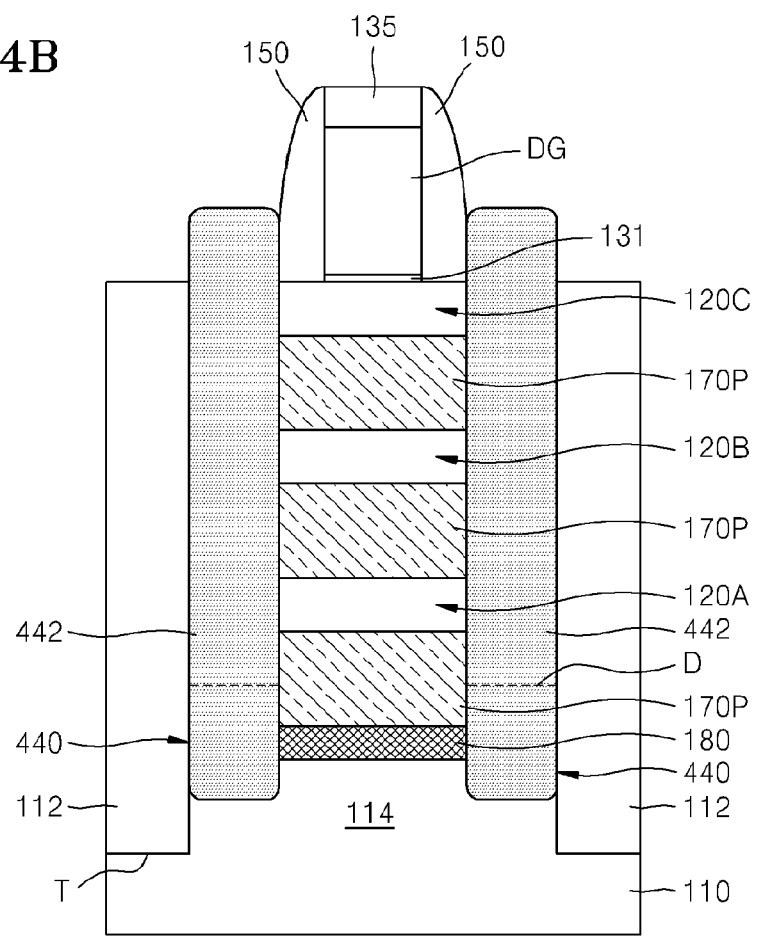
Figure 25A:
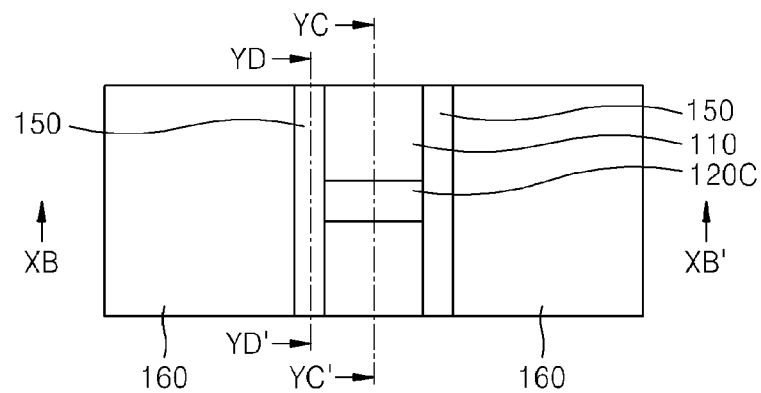
Figure 25B:
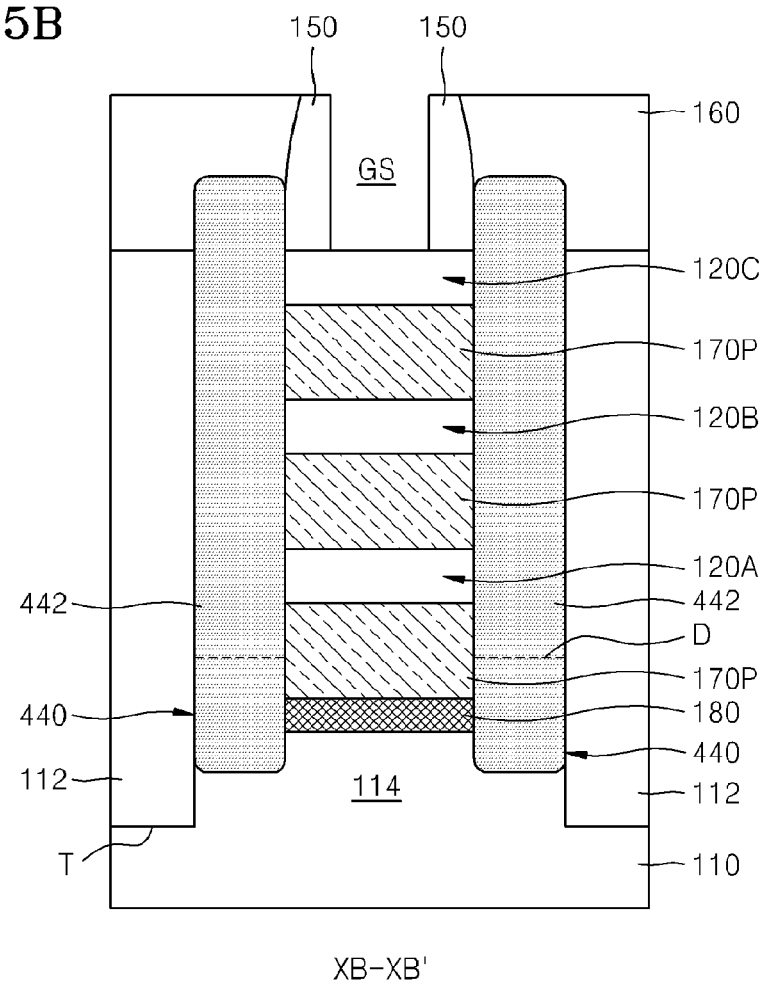
Figure 25C:
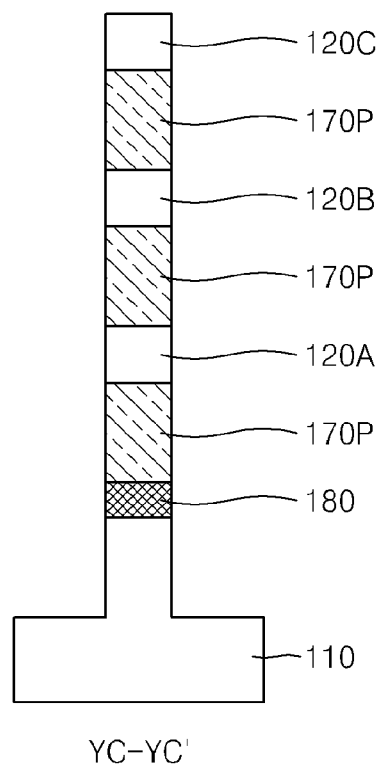
Figure 25D:
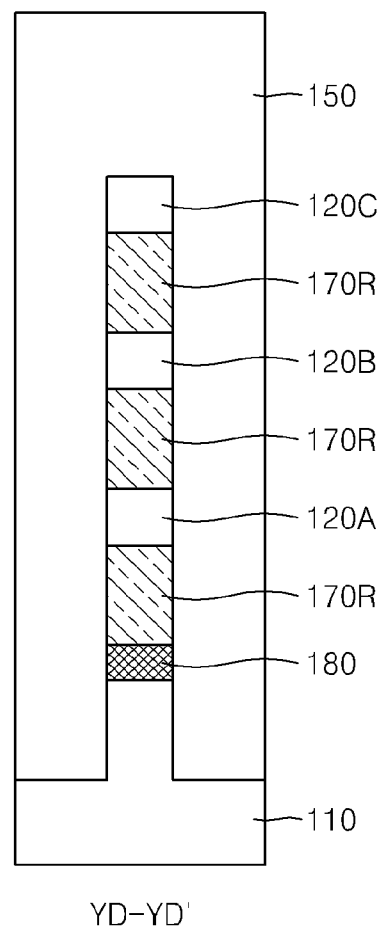
Figure 26A:
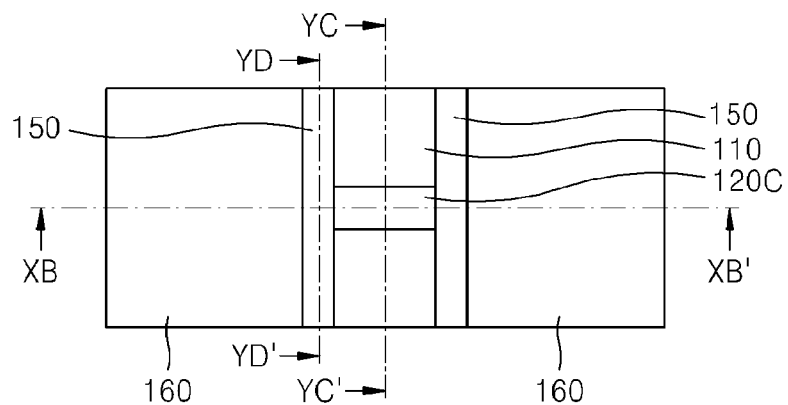
Figure 26B:
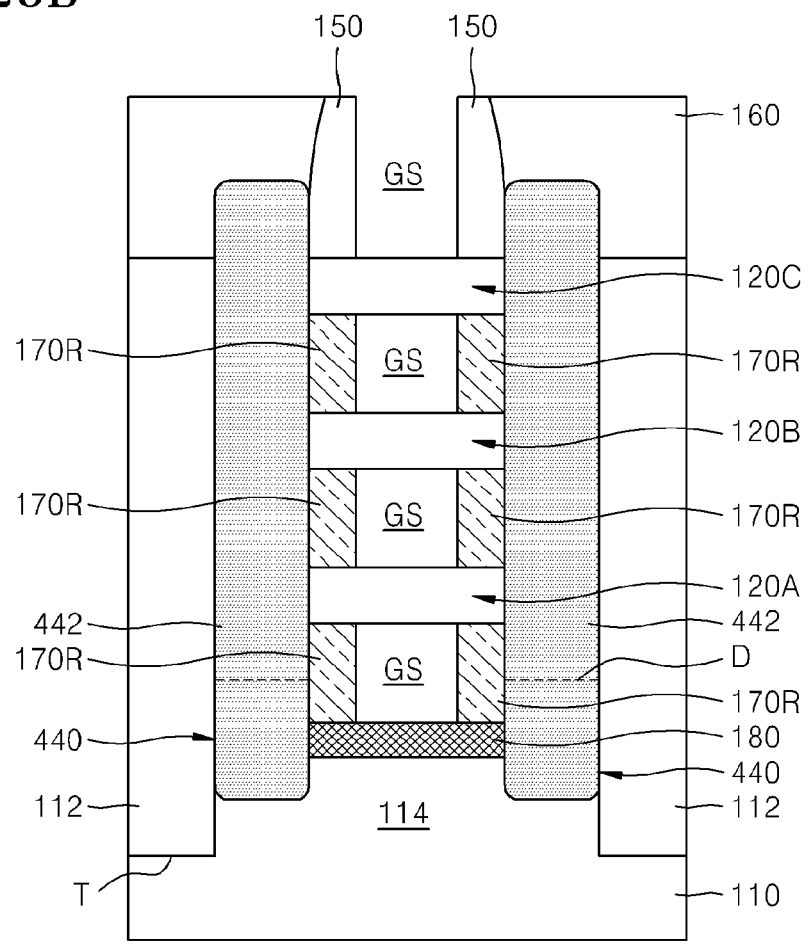
Figure 26C:
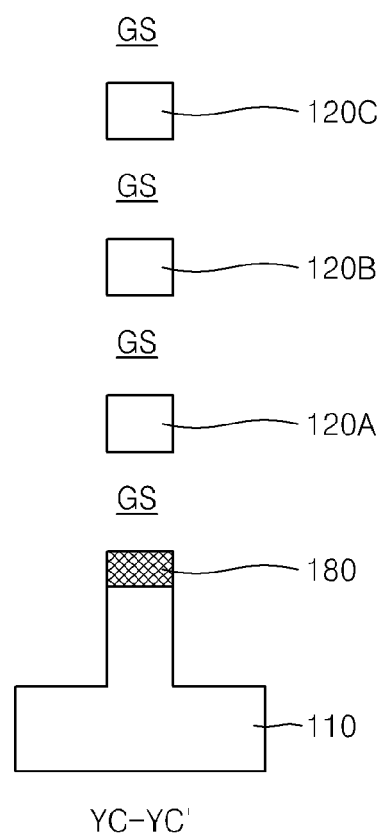
Figure 26D:
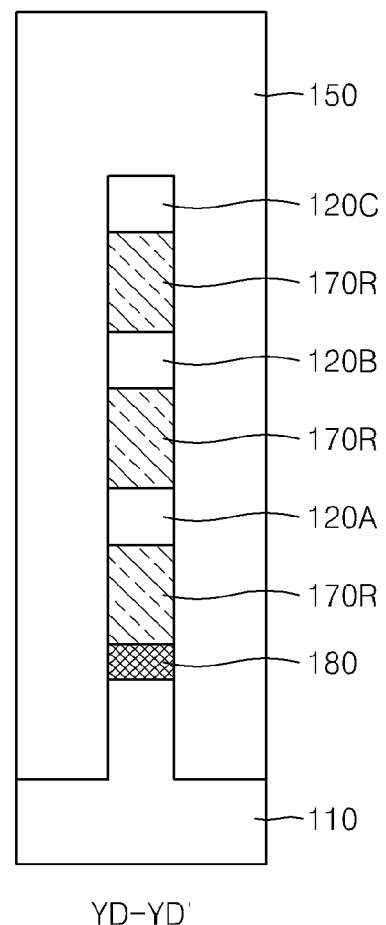
Figure 27A:
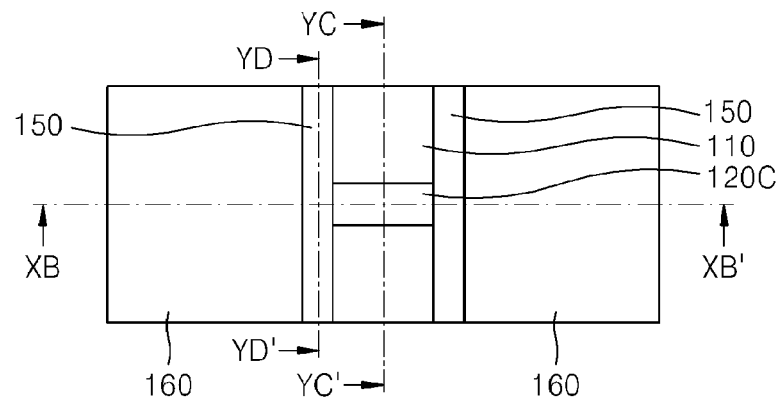
Figure 27B:
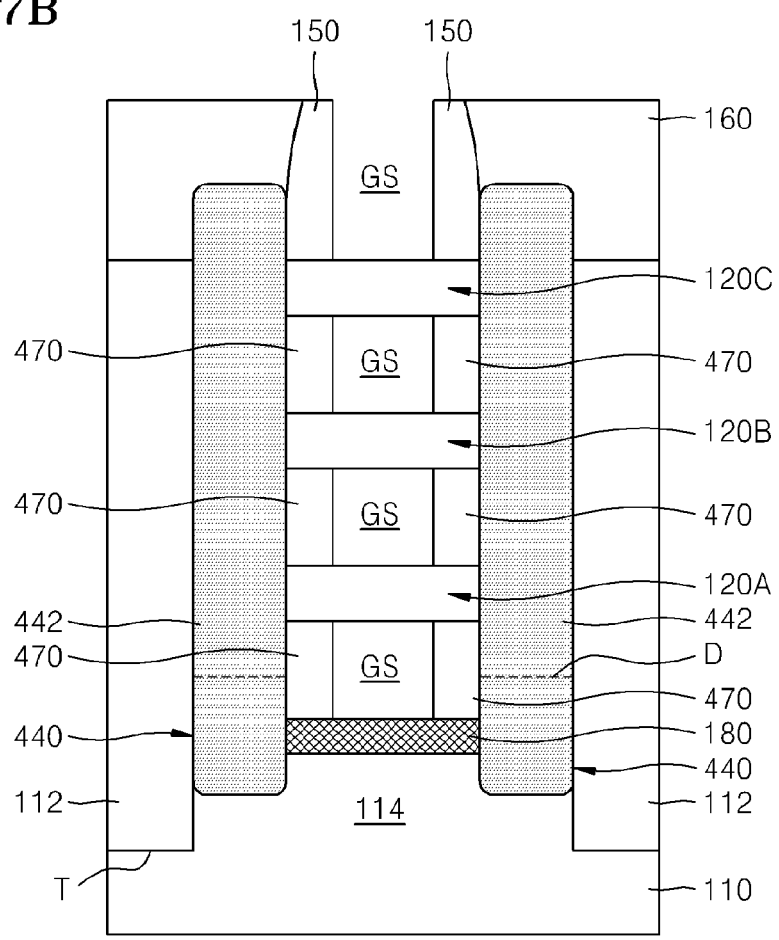
Figure 27C:
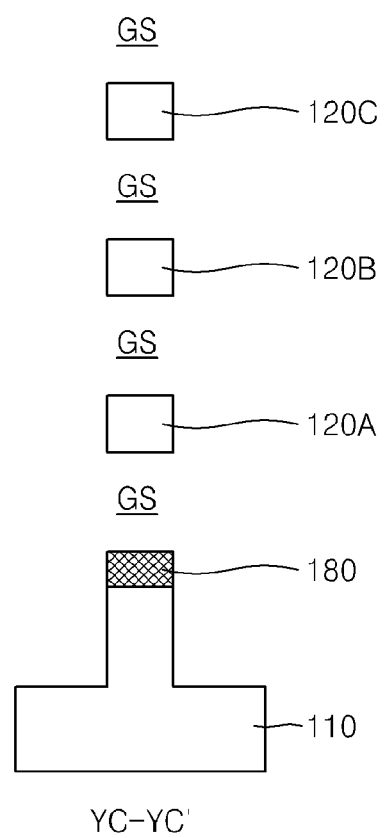
Figure 27D:
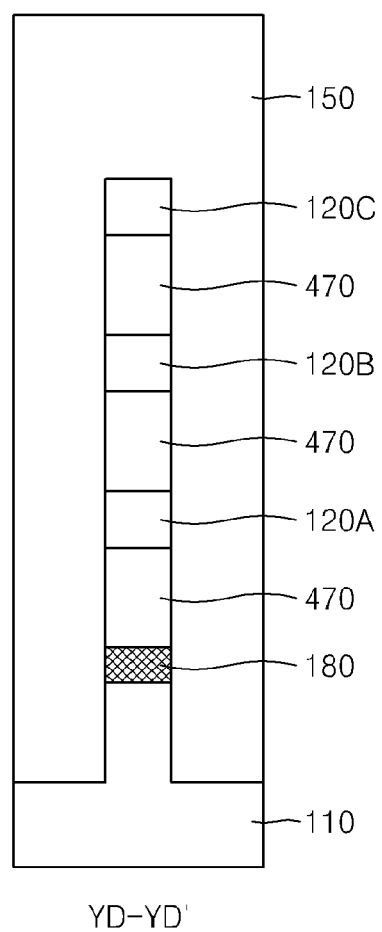

Referring to FIGS. 24A and 24B, one pair of source/drain regions 442 and one pair of semiconductor layers 440 that are disposed at both sides of the dummy gate structure DG are formed by using a method similar to a process of forming the semiconductor layers 140 and the source/drain regions 142 described with reference to FIGS. 8A through 9B.

Referring to FIGS. 25A through 25D, the dummy gate structure DG is removed by using a method similar to that described with reference to FIGS. 10A through 11D, to make the gate space GS remain between the outer insulating spacers 150.

Referring to FIGS. 26A through 26D, the gate space GS is extended to a space between the plurality of nanowires 120A, 120B, and 120C and a space between the nanowire 140A and the substrate 110 by selectively removing a portion of the sacrificial layer 170P which is exposed through the gate space GS by using a method similar to that described with reference to FIGS. 12A through 12D.

While a portion of the sacrificial layer 170P which is exposed through the gate space GS is removed, portions of the sacrificial layer 170P that are surrounded by the outer insulating spacers 150 are protected by the outer insulating spacers 150 without being removed, and may remain as the residual sacrificial layer 170R.

Referring to FIGS. 27A through 27D, the plurality of inner insulating spacers 470 are formed by oxidizing the residual sacrificial layer 170R that remains between the substrate 110 and the nanowire 120A, between the nanowire 120A and the nanowire 120B, and between the nanowire 120B and the nanowire 120C by using a method similar to that described with reference to FIGS. 13A through 13D.

While the residual sacrificial layer 170R is completely oxidized, a relatively thin surface oxide film may be formed on an exposed surface of the channel isolation region 180 formed on the nanowires 120A, 120B, and 120C and the substrate 110. In this case, an oxidation rate of the residual sacrificial layer 170R may be much higher than an oxidation rate of each of the nanowires 120A, 120B, and 120C and the substrate 110. Accordingly, a thickness of the surface oxide film may be very low.

Referring to FIGS. 28A through 28D, the surface oxide film that is formed on exposed surfaces of the nanowires 120A, 120B, and 120C and the channel isolation region 180 is removed by using a method similar to that described with reference to FIGS. 14A through 14D, and then the gate dielectric film 432 is formed on exposed surfaces in the gate space GS and the gate 430 that fills the gate space GS is formed on the gate dielectric film 432. The gate 430 includes the sub-gates 430A, 430B, and 430C that are formed in a space between the substrate 110 and the plurality of nanowires 120A, 120B, and 120C.

For example, a plurality of contact holes through which the source/drain regions 442 are exposed are formed by etching a part of the insulating film 160, and then the metal silicide film 164 may be formed on top surfaces of the source/drain regions 442 which are exposed through the contact holes and the contacts 162 that are respectively connected to the source/drain regions 442 through the metal silicide film 164 may be formed, thereby forming the semiconductor device 400 of FIGS. 20A through 20D.

In FIGS. 21A through 28D, a method of oxidizing the residual sacrificial layer 170R (see FIGS. 12B and 12D) described with reference to FIGS. 13A through 13D has been used in order to form the plurality of inner insulating spacers 470 that are included in the semiconductor device 400. However, the present embodiment is not limited thereto. In an embodiment, a process similar to a method of forming the inner insulating spacers 170X by oxidizing a part of the sacrificial layer 170P described with reference to FIG. 15A may be performed in order to form the plurality of inner insulating spacers 470 included in the semiconductor device 400. Alternatively, the same deposition as deposition for forming the inner insulating spacers 170Y described with reference to FIGS. 16A through 16C may be used in order to form the plurality of inner insulating spacers 470 included in the semiconductor device 400.

The semiconductor devices of FIGS. 1A through 28D may constitute a transistor constituting a digital circuit or an analog circuit. In an embodiment, the semiconductor devices may be used as a high voltage transistor or a low voltage transistor. For example, the semiconductor devices may constitute a high-voltage transistor constituting a peripheral circuit of a nonvolatile memory device such as a flash memory device or an EEPROM device that operates at a high voltage. Alternatively, the semiconductor devices may constitute a transistor included in an integrated circuit (IC) chip that is used for a liquid crystal display (LCD) IC device that requires an operating voltage of 10 V or more, for example, about 20 V to about 30 V, or a plasma display panel (PDP) that requires an operating voltage of about 100 V.

Figure 29:
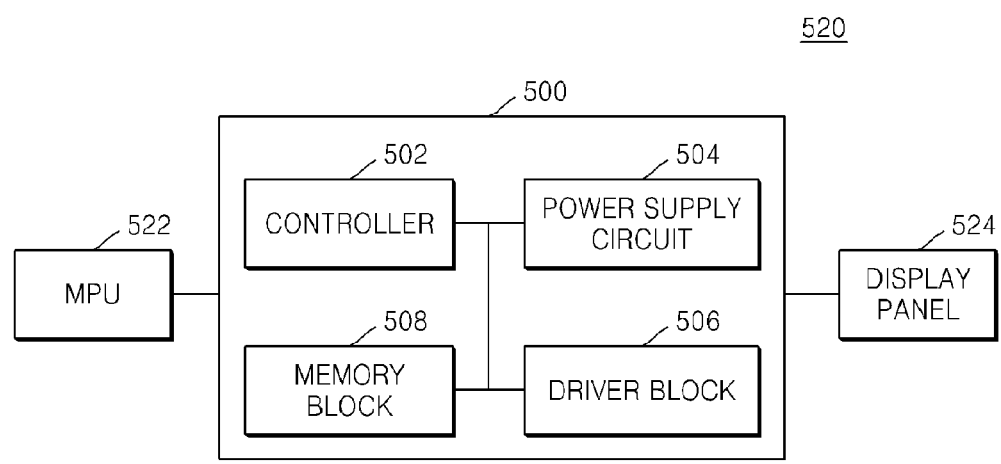
FIG. 29 is an exemplary block diagram illustrating a display driver integrated circuit (DDI) and a display device including the DDI, according to certain embodiments.

FIG. 29 is an exemplary block diagram illustrating a display driver IC (DDI) 500 and a display device 520 including the DDI 500, according to certain embodiments.

Referring to FIG. 29, the DDI 500 includes a controller 502, a power supply circuit 504, a driver block 506, and a memory block 508. The controller 502 receives and decodes a command applied from a main processing unit (MPU) 522, and controls blocks of the DDI 500 in order to perform an operation in response to the command. The power supply circuit 504 generates a driving voltage under the control of the controller 502. The driver block 506 drives the display panel 524 by using the driving voltage generated by the power supply circuit 504 under the control of the controller 502. The display panel 524 may be an LCD panel or a plasma display panel. The memory block 508 may be temporarily store control signals output from the controller 502 or a command input to the controller 502, or may store necessary data. The memory block 508 may include a memory such as a RAM or a ROM. The power supply circuit 504 and the driver block 506 may include at least one of the semiconductor devices 100A, 100B, 200, 300, and 400 of FIGS. 1A through 28D.

Figure 30:
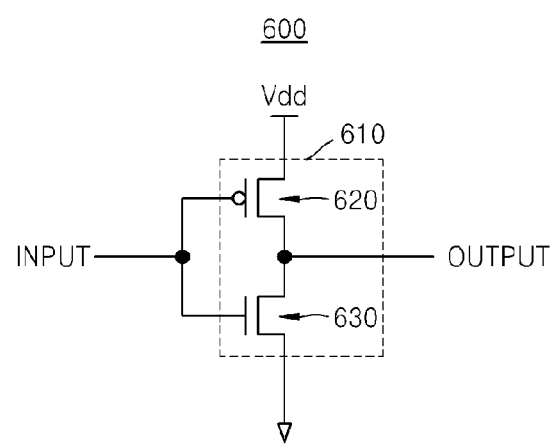
FIG. 30 is an exemplary circuit diagram illustrating a complementary metal-oxide-semiconductor (CMOS) inverter according to certain embodiments.

FIG. 30 is an exemplary circuit diagram illustrating a CMOS inverter 600 according to certain embodiments.

The CMOS inverter 600 includes a CMOS transistor 610. The CMOS transistor 610 includes a PMOS transistor 620 and an NMOS transistor 630 that are connected between a power terminal Vdd and a ground terminal. The CMOS transistor 610 may include at least one of the semiconductor devices 100A, 100B, 200, 300, and 400 of FIGS. 1A through 28D.

Figure 31:
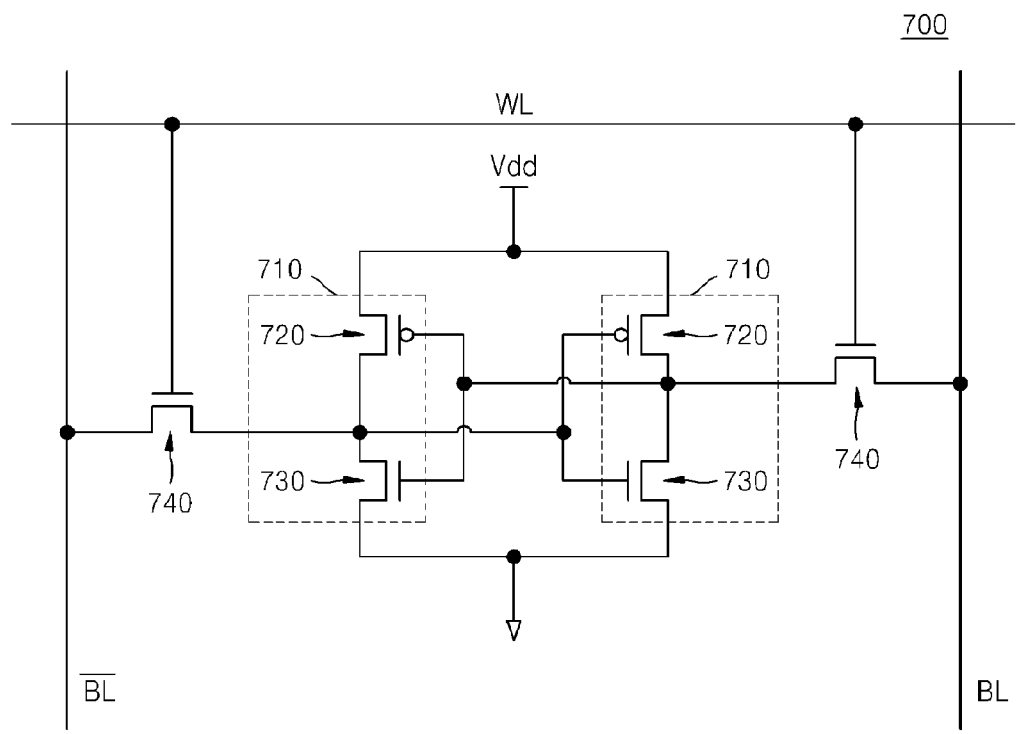
FIG. 31 is an exemplary circuit diagram illustrating a CMOS static random access memory (SRAM) device according to certain embodiments.

FIG. 31 is an exemplary circuit diagram illustrating a CMOS SRAM device 700 according to certain embodiments.

The CMOS SRAM device 700 includes a pair of driving transistors 710. Each of the driving transistors 710 includes a PMOS transistor 720 and an NMOS transistor 730 that are connected between a power terminal Vdd and a ground terminal. The CMOS SRAM device 700 further includes a pair of transmission transistors 740. A source of each of the transmission transistors 740 is cross-connected to a common node of the PMOS transistor 720 and the NMOS transistor 730 constituting the driving transistor 710. The power terminal Vdd is connected to a source of the PMOS transistor 720, and the ground terminal is connected to a source of the NMOS transistor 730. A word line WL is connected to gates of the transmission transistors 740, and a bit line BL and an inverted bit line are respectively connected to drains of the transmission transistors 740.

At least one of the driving transistor 710 and the transmission transistor 740 of the CMOS SRAM device 700 may include at least one of the semiconductor devices 100A, 100B, 200, 300, and 400 of FIGS. 1A through 28D.

Figure 32:
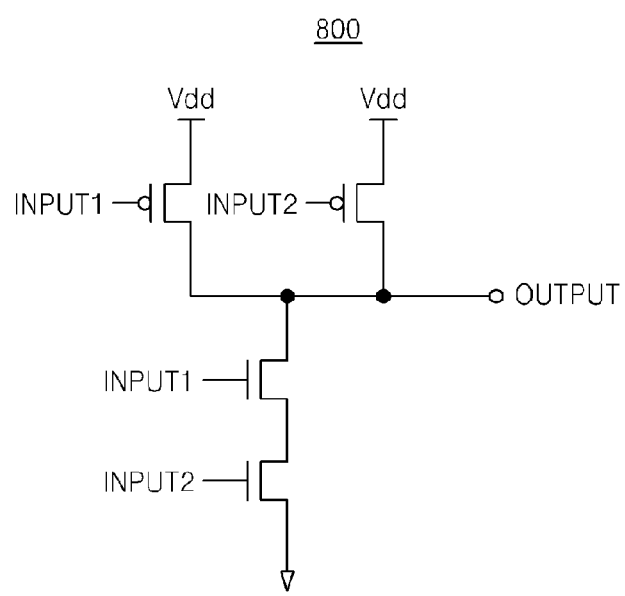
FIG. 32 is an exemplary circuit diagram illustrating a CMOS NAND circuit according to certain embodiments.

FIG. 32 is an exemplary circuit diagram illustrating a CMOS NAND circuit 800 according to certain embodiments.

The CMOS NAND circuit 800 includes a pair of CMOS transistors to which different input signals are transmitted. The CMOS NAND circuit 800 may include at least one of the semiconductor devices 100A, 100B, 200, 300, and 400 of FIGS. 1A through 28D.

Figure 33:
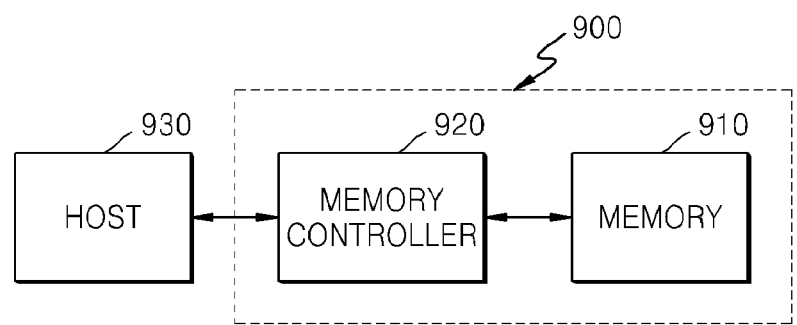
FIG. 33 is an exemplary block diagram illustrating an electronic system according to certain embodiments.

FIG. 33 is an exemplary block diagram illustrating an electronic system 900 according to certain embodiments.

The electronic system 900 includes a memory 910 and a memory controller 920. The memory controller 920 controls the memory 910 to read data from the memory 910 and/or write data to the memory 910 in response to a request of a host 930. At least one of the memory 910 and the memory controller 920 may include at least one of the semiconductor devices 100A, 100B, 200, 300, and 400 of FIGS. 1A through 28D.

Figure 34:
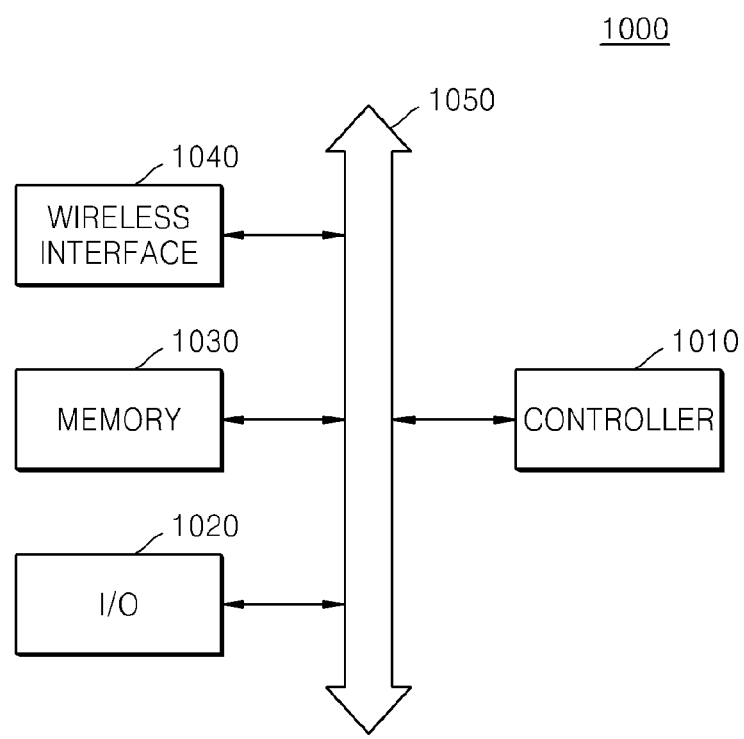
FIG. 34 is an exemplary block diagram illustrating an electronic system according to certain embodiments.

FIG. 34 is an exemplary block diagram illustrating an electronic system 1000 according to certain embodiments.

The electronic system 1000 may constitute a wireless communication device or a device for wirelessly transmitting and/or receiving information. The electronic system 1000 includes a controller 1010, an input/output (I/O) device 1020, a memory 1030, and a wireless interface 1040, which are connected to one another via a bus 1050.

The controller 1010 may include at least one of, for example, a microprocessor, a digital signal process, and a processing device. The I/O device 1020 may include at least one of a keypad, a keyboard, and a display unit. The memory 1030 may be used to store a command executed by the controller 1010. For example, the memory 1030 may be used to store user data. The electronic system 1000 may use the wireless interface 1040 in order to transmit/receive data through a wireless communication network. The wireless interface 1040 may include an antenna and/or a wireless transceiver. In an embodiment, the electronic system 1000 may be used for a communication interface protocol of a third generation communication system such as code division multiple access (CDMA), global system for mobile communications (GSM), north American digital cellular (NADC), extended-time division multiple access (E-TDMA), and/or wide band code division multiple access (WCDMA). The electronic system 1000 may include at least one of the semiconductor devices 100A, 100B, 200, 300, and 400 of FIGS. 1A through 28D.

According to a semiconductor device of the disclosure, a source/drain region is formed in a re-grown semiconductor layer. A gate is formed to be spaced in a main surface extension direction of a substrate from the source/drain region. Accordingly, a gate parasitic capacitance and a leakage current between the gate and the source/drain region may be effectively suppressed. Also, since a material of the semiconductor layer in which the source/drain region is formed has a lattice constant that is different from a lattice constant of a nanowire on which a channel is formed, the source/drain region may act as a stressor for applying a compressive or tensile stress to a channel region. Also, since not only a gate dielectric film but also inner insulating spacers are disposed between the gate and the source/drain region, a gate parasitic capacitance and a leakage current between the gate and the source/drain region may be more effectively suppressed.

While the present disclosure has been particularly shown and described with reference to exemplary embodiments thereof, it will be understood that various changes in form and details may be made therein without departing from the spirit and scope of the following claims.

What is claimed is:

1. A semiconductor device comprising:
   a substrate having an active region, the active region having a pair of trenches and a top surface between the pair of trenches;
   a nanowire having a channel region, the nanowire extending over the top surface of the active region;
   a gate surrounding the nanowire on the top surface of the active region;
   a gate dielectric film interposed between the nanowire and the gate;
   a pair of semiconductor layers extending from bottoms of the pair of trenches to both ends of the nanowire, the pair of semiconductor layers comprising source/drain regions contacting the both ends of the nanowire; and
   insulating spacers interposed between the gate and the source/drain regions, wherein the bottoms of the source/drain regions are at a level lower than the top surface of the active region, wherein the insulating spacers comprise an inner insulating spacer and an outer insulating spacer disposed at different levels on the active region to vertically overlap with each other, wherein the inner insulating spacer covers a lower sidewall of the gate between the active region and the nanowire, and the outer insulating spacer covers an upper sidewall of the gate on the nanowire, and wherein the inner insulating spacer and the outer insulating spacer are formed of different materials.

2. The semiconductor device of claim 1, wherein the inner insulating spacer is formed of a material having a dielectric constant lower than a dielectric constant of a material of the outer insulating spacer.

3. The semiconductor device of claim 1, wherein the inner insulating spacer is formed of an oxide of a group IV semiconductor, an oxide of a group IV-IV compound semiconductor, an oxide of a group III-V compound semiconductor, or a silicon oxide.

4. The semiconductor device of claim 1, wherein the inner insulating spacer is formed of a SiGe oxide or an InP oxide.

5. The semiconductor device of claim 1, wherein the gate dielectric film is disposed between the gate and the inner insulating spacer and between the gate and the outer insulating spacer.

6. The semiconductor device of claim 1, wherein the pair of semiconductor layers are formed of a SiGe film, a Ge film, a SiC film, or an InGaAs film.

7. The semiconductor device of claim 1, further comprising a channel isolation region disposed between the active region and the gate, the channel isolation region being in contact with the gate dielectric film.

8. The semiconductor device of claim 7, wherein the source/drain regions include a first conductivity type of impurity ions, and the channel isolation region includes a second conductivity type of impurity ions, the second conductivity type being opposite to the first conductivity type.

9. The semiconductor device of claim 1, wherein the source/drain regions are disposed above the active region.

10. A semiconductor device comprising:
a substrate having an active region, the active region having a pair of trenches and a top surface between the pair of trenches;
a plurality of nanowires extending over the top surface of the active region;
a gate surrounding the plurality of nanowires on the top surface of the active region;
a gate dielectric film interposed between the plurality of nanowires and the gate;
a pair of semiconductor layers extending from bottoms of the pair of trenches to ends of the plurality of nanowires, the pair of semiconductor layers comprising source/drain regions contacting the ends of the plurality of nanowires; and
insulating spacers interposed between the gate and the source/drain regions, wherein the bottoms of the source/drain regions are at a level lower than the top surface of the active region,
wherein the insulating spacers comprise:
outer insulating spacers disposed over the plurality of nanowires, the outer insulating spacers having top surfaces higher than top surfaces of the source/drain regions; and
inner insulating spacers disposed between the substrate and the outer insulating spacers, the inner insulating spacers having top surfaces lower than the top surfaces of the source/drain regions, and
wherein the inner insulating spacers are formed of a material having a dielectric constant lower than a dielectric constant of a material of the outer insulating spacers.

11. The semiconductor device of claim 10, wherein the plurality of nanowires are disposed at different levels on the active region to vertically overlap with each other, and
wherein the insulating spacers comprise at least one inner insulating spacer disposed between the plurality of nanowires.

12. The semiconductor device of claim 10, wherein the insulating spacers comprise at least one inner insulating spacer disposed between the substrate and the plurality of nanowires.

13. The semiconductor device of claim 10, wherein the insulating spacers are formed of a material that is different from a material of the gate dielectric film.

14. The semiconductor device of claim 10, wherein the source/drain regions extend to a level higher than a top-most level of the plurality of nanowires.

15. A semiconductor device comprising:
a first transistor formed on a first active region of a substrate, the first active region having a pair of first trenches and a first top surface between the pair of first trenches; and
a second transistor formed on a second active region of the substrate, the second active region having a pair of second trenches and a second top surface between the pair of second trenches,
wherein the first transistor comprises:
a first nanowire having a first channel region extending over the first active region;
a first gate surrounding the first nanowire;
a first gate dielectric film interposed between the first nanowire and the first gate;
a pair of first semiconductor layers extending from bottoms of the pair of first trenches to both ends of the first nanowire; and
first insulating spacers interposed between the first gate and the pair of first semiconductor layers,
wherein the first insulating spacers comprise a first inner insulating spacer and a first outer insulating spacer disposed at different levels on the first active region to vertically overlap with each other, and
wherein the first inner insulating spacer is formed of a material having a dielectric constant lower than a dielectric constant of a material of the first outer insulating spacer, and
wherein the second transistor comprises:
a second nanowire having a second channel region extending over the second active region;
a second gate surrounding the second nanowire;
a second gate dielectric film interposed between the second nanowire and the second gate;
a pair of second semiconductor layers extending from bottoms of the pair of second trenches to both ends of the second nanowire, the pair of second semiconductor layers formed of a material different from a material of the pair of first semiconductor layers; and
second insulating spacers interposed between the second gate and the pair of second semiconductor layers,
wherein the second insulating spacers comprise a second inner insulating spacer and a second outer insulating spacer disposed at different levels on the second active region to vertically overlap with each other, and wherein the second inner insulating spacer is formed of a material having a dielectric constant lower than a dielectric constant of a material of the second outer insulating spacer.

16. The semiconductor device of claim 15, wherein at least one of the first inner insulating spacer and the second inner insulating spacer is formed of an oxide of a group IV semiconductor, an oxide of a group IV-IV compound semiconductor, an oxide of a group III-V compound semiconductor, or a silicon oxide.

* * * * *